US008274148B2

(12) United States Patent
Yanase et al.

(10) Patent No.: US 8,274,148 B2
(45) Date of Patent: Sep. 25, 2012

(54) SEMICONDUCTOR MODULE

(75) Inventors: Yasuyuki Yanase, Moriguchi (JP); Atsunobu Suzuki, Moriguchi (JP); Yoshio Okayama, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 313 days.

(21) Appl. No.: 12/727,565

(22) Filed: Mar. 19, 2010

(65) Prior Publication Data

US 2010/0276800 A1 Nov. 4, 2010

(30) Foreign Application Priority Data

Apr. 30, 2009 (JP) ................................ 2009-110919

(51) Int. Cl.
*H01L 23/48* (2006.01)
*H01L 23/52* (2006.01)

(52) U.S. Cl. ........ 257/737; 257/686; 257/778; 257/777; 257/E23.021; 257/E23.169

(58) Field of Classification Search .................. 257/737, 257/686, 778, 777, E23.021, E23.169
See application file for complete search history.

(56) References Cited

U.S. PATENT DOCUMENTS 5,241,456 A * 8/1993 Marcinkiewicz et al. .... 361/792
5,497,033 A * 3/1996 Fillion et al. .................. 257/723
5,854,507 A * 12/1998 Miremadi et al. ............ 257/686
6,239,496 B1 * 5/2001 Asada ........................... 257/777
6,506,632 B1 * 1/2003 Cheng et al. .................. 438/126
6,633,081 B2 * 10/2003 Sahara et al. ................. 257/738
6,995,455 B2 * 2/2006 Nemoto et al. ............... 257/621
7,276,799 B2 * 10/2007 Lee et al. ...................... 257/777
7,492,045 B2 2/2009 Okayama et al.
2005/0116337 A1 * 6/2005 Chua et al. .................... 257/723
2005/0263869 A1 * 12/2005 Tanaka et al. ................. 257/686
2007/0035033 A1 * 2/2007 Ozguz et al. .................. 257/777
2008/0224306 A1 * 9/2008 Yang ............................. 257/725
2008/0280394 A1 11/2008 Murtuza et al.

FOREIGN PATENT DOCUMENTS

CN 101197338 A 6/2008
JP 2007-158319 6/2007

OTHER PUBLICATIONS

Chinese Office Action, w/ English translation thereof, issued in Chinese Patent Application No. 201010155369.1, dated Sep. 26, 2011.

* cited by examiner

*Primary Examiner* — Nitin Parekh
(74) *Attorney, Agent, or Firm* — McDermott Will & Emery LLP

(57) ABSTRACT

A first circuit element and a second element are mounted with their electrode forming surfaces facing a wiring layer. A first bump electrode formed integrally with the wiring layer on one face substantially penetrates a first insulating resin layer. A gold plating layer covering an element electrode of the first circuit element and a gold plating layer disposed on top of the first bump electrode are bonded together by Au—Au bonding. A second bump electrode formed integrally with the wiring layer on one face substantially penetrates the first and the second insulating resin layer. A gold plating layer covering an element electrode of the second circuit element and a gold plating layer disposed on top of the second bump electrode are bonded together by Au—Au bonding.

7 Claims, 19 Drawing Sheets

84 82 80 54 52 50 90 72 70 60 30 110 20 42 40 20 110 100 40 20 100 20

10

210
200

70
200

220b
220a
70
200

70
40
200

70
40
230
200

70
72
42
40
200

200
30
40
42
50
52
54
60
70
72
80
82
84

200
32
70
72
32
42
40
40
72
70

250
80
50
120
82
84
80
50
120
82
84
82
84
80
50
120
52
54
82
84

250
200
84
82
50
120
80
32
54
52
72
70
40
42
40
32
72
70

250
84
82
50
120
80
32
52 54
70 72
40
42
20
32
72
70
20

250
100
84
82
50
120
80
110
32
52 54
110
70 72
100
40
110
42
20
32
72
70
100
110

80
110 100
10
84
82
50
120
80
110
100
10
32
52 54
70 72
40
80
10
42
20
32
72
70
100
110

310
320
320

310
304
320
304
304
320

250
310
80
60
82
84
82
84
80
60
304
320
304
80
60
304
320

250
300
80
60
82
84
82
84
80
60
304
300
304
80
60
304
300

250
300
80
60
82
84
82
302
84
80
60
304
302
300
304
302
80
60
304
302
300

SEMICONDUCTOR MODULE

CROSS-REFERENCE TO RELATED APPLICATIONS

This application is based upon and claims the benefit of priority from the prior Japanese Patent Applications No. 2009-110919, filed on Apr. 30, 2009, the entire contents of which are incorporated herein by reference.

BACKGROUND OF THE INVENTION

1. Field of the Invention

The present invention relates to a semiconductor module mounting a plurality of circuit elements thereon.

2. Description of the Related Art

Portable electronic devices, such as mobile phones, PDAs, DVCs, and DSCs, are today gaining an increasing variety of functions. And to be accepted by the market, they have to be smaller in size and lighter in weight, and for that reason, there is a growing demand for highly-integrated system LSIs. On the other hand, these electronic devices are expected to be easier or handier to use, and therefore the LSIs used in those devices are required to be more functionally sophisticated and better performing. Thus the higher integration of LSI chips is causing increases in I/O count, which in turn generate demand for smaller packages. To satisfy both these requirements, it is strongly expected that semiconductor packages just right for the high board density packaging of semiconductor components be developed.

As a packaging technology to meet these demands for higher density, known are multi-chip modules (MCM) employing a multiple stack structure for the multilayering of circuit elements.

For example, a structure is known where two circuit elements with their electrode forming surfaces facing upward are stacked on a substrate and lower and upper circuit elements and wirings provided on the substrate are electrically wire-bonded, respectively.

In the conventional structure where the circuit elements and the wiring on the substrate side are connected through wire bonding, the height or thickness of a wire used in the wire bonding must be taken into consideration and assured. Accordingly, this becomes a restrictive factor in reducing the height and thickness of the semiconductor module, thus making it difficult to downsize and reduce the thickness of the semiconductor module.

SUMMARY OF THE INVENTION

The present invention has been made in view of the foregoing problems, and a purpose thereof is to provide a technique by which to reduce the size and thickness of a semiconductor module in which a plurality of circuit elements are stacked and mounted.

One embodiment of the present invention relates to a semiconductor module. The semiconductor module comprising: a wiring layer having a predetermine pattern; a first bump electrode formed integrally with the wiring layer on one face thereof; a first circuit element mounted in a state such that an electrode forming surface of the first circuit element is disposed counter to the one face of the wiring layer, an element electrode electrically connected to the first bump electrode being provided on the electrode forming surface thereof; a second bump electrode formed integrally with the wiring layer on the one face thereof on a periphery of the first circuit element, the length of protrusion of the second bump electrode being greater than that of the first bump electrode; and a second circuit element mounted above the first circuit element in a state such that an electrode forming surface of the second circuit element is disposed counter to the one face of said wiring layer, an element electrode electrically connected to the second bump being provided on the electrode forming surface thereof.

In the semiconductor module according to the above-described semiconductor module, the first circuit element and the second circuit element are both flip-chip mounted, and the first circuit element and the second circuit element are electrically connected the wiring layers using the first bump electrode and the second bump electrode each integrally formed with the wiring layer. Thereby, the impediments to the reduction in the height or width of the semiconductor module where the circuit elements are wire bonded are resolved and therefore the size and the thickness of the semiconductor module can be further reduced.

In the semiconductor module according to the above-described embodiment, the length of protrusion of the second bump electrode may be greater than or equal to the distance from a surface of the first circuit element opposite to the electrode forming surface thereof to the one face of the wiring layer. Also, the second bump electrode may has a side shape having a local maximum diameter in a protruded position corresponding to the length of protrusion of the first bump electrode or in a protruded position closer to a second circuit element side than the protruded position corresponding thereto. Also, another metallic layers including gold-gold bonding layers are provided between the first bump electrode and the element electrode provided in the first circuit element and/or between the bump electrode and the element electrode provided in the second circuit element, respectively.

Another embodiment of the present invention relates also to a semiconductor module. The semiconductor module comprises: a wiring layer having a predetermine pattern; a first bump electrode formed integrally with the wiring layer on one face thereof; a first circuit element mounted in a state such that an electrode forming surface of the first circuit element is disposed counter to the one face of the wiring layer, an element electrode electrically connected to the first bump electrode being provided on the electrode forming surface thereof; a second bump electrode formed integrally with the wiring layer on the one face thereof on a periphery of the first circuit element; a conductor connected disposed above the second bump electrode and connected electrically to the second bump electrode; and a second circuit element mounted above the first circuit element in a state such that an electrode forming surface of the second circuit element is disposed counter to the one face of the wiring layer, an element electrode electrically connected to the conductor being provided on the electrode forming surface thereof, wherein the distance from a second circuit element side of said conductor to the one face of said wiring layer is larger than the length of protrusion of the first bump electrode.

In the above-described semiconductor modules, the impediments to the reduction in the height or width of the semiconductor module where the circuit elements are wire bonded are resolved and therefore the size and the thickness of the semiconductor module can be further reduced.

In the semiconductor module according to the above-described semiconductor module, the distance from a second circuit element side of the conductor to the one face of said wiring layer may be larger than or equal to the distance from a surface of the first circuit element opposite to the electrode forming surface thereof to the one face of the wiring layer. The semiconductor module may further comprise another wiring layer, provided between the second bump electrode and the conductor, on one face of which the conductor is integrally formed with, wherein a connection position of the another wiring layer in the other surface thereof, to which the second bump electrode is electrically connected, may be dislocated relative to a forming position and a surface orientation of the conductor on one face of the another wiring layer.

Still another embodiment of the present invention relates also to a semiconductor module. The semiconductor module comprises: a wiring layer having a predetermine pattern; a bump electrode formed integrally with the wiring layer on one face of the wiring layer; a second circuit element mounted in a state such that an electrode forming surface of the second circuit element is disposed counter to the one face of the wiring layer, an element electrode electrically connected to the bump electrode being provided on the electrode forming surface thereof; and a first circuit element disposed between the one face of the wiring layer and the electrode forming surface of the second circuit element.

In this embodiment, the length of protrusion of the bump electrode may be greater than or equal to the distance from a surface of the second circuit element on a first circuit element side to the one face of the wiring layer.

Still another embodiment relates to a portable device. The portable device is characterized in that it mounts a semiconductor module according to any one of the above-described embodiments.

It is to be noted that any arbitrary combinations or rearrangement, as appropriate, of the aforementioned constituting elements and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting, and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

The preferred embodiments of the present invention will be described with reference to accompanying drawings. Note that in all the Figures, the same reference numbers are used to indicate the same or similar component elements and the description thereof is omitted as appropriate.

First Embodiment

Figure 1:
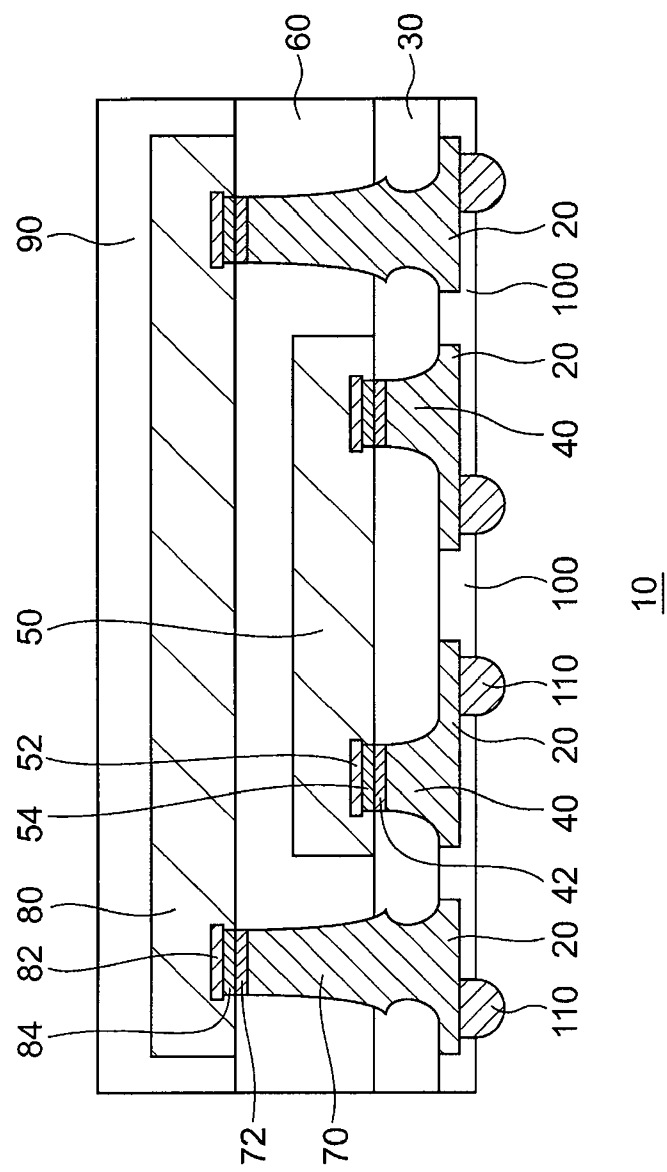
FIG. 1 is a cross-sectional view showing a structure of a semiconductor module according to a first embodiment of the present invention.

FIG. 1 is a cross-sectional view showing a structure of a semiconductor module 10 according to a first embodiment of the present invention.

A wiring layer 20 is a conductive layer having a predetermined pattern. The wiring layer 20 is formed of a conducive material such as copper, preferably of a rolled metal or more preferably of a rolled copper.

A first insulating resin layer 30 is provided on one face of the wiring layer 20, namely one face thereof on a circuit element mounting side. The first insulating resin layer 30 electrically insulates the wiring layer 20 and the first circuit element 50. The first insulating resin layer 30 may be made of, for example, a thermosetting resin such as a melamine derivative (e.g., BT resin), liquid-crystal polymer, epoxy resin, polyphenylene ether (PPE) resin, polyimide resin, fluorine resin, phenol resin, polyamide bismaleimide, or the like. The thickness of the first insulating resin layer 30 is equal to the distance from one face of the wiring layer 20 to an electrode forming surface of the first circuit element 50 described later, and is about 20 μm, for instance.

A plurality of first bump electrodes 40 are formed on the one face of the wiring layer 20. Since the first bump electrodes 40 are formed integrally with the wiring layer 20, the connection strength between the first bump electrode 40 and the wiring layer 20 is enhanced. The first bump electrode 40 either penetrates the first insulating resin layer 30 or constitutes a principal part of conductor penetrating the first insulating resin layer 30. Thus, the first bump electrodes 40 contribute to the electrical connection between an element electrode 52 of a first circuit element 50 described later and the wiring layer 20. The diameter of top of the first bump electrode 40 is about 30 μm, for instance.

The electrode forming surface of the first circuit element 50, which is disposed counter to the one face of the wiring layer 20, namely which is positioned downward, is mounted on the first insulating resin layer 30. The first circuit element 50 is an active element, such as an integrated circuit (IC) and a large-scale integrated circuit (LSI), or passive element, such as a resistor, a capacitor and an inductor. An element electrode 52 is provided, as an external connection terminal, on the electrode forming surface of the first circuit element 50. The element electrode 52 is formed of a metal such as aluminum.

The element electrode 52 is disposed in a position corresponding to the first bump electrode 40 and is electrically connected to the first bump electrode 40. More specifically, the surface of the element electrode 52 is covered with a gold plating layer 54. On the other hand, top of the first bump electrode 40 is also covered with a gold plating layer 42. The formation of the gold-gold bonding (gold-gold interconnection) between the element electrode 52 and the first bump electrode 40 enhances the connection reliability between the element electrode 52 and the first bump electrode 40. The gold plating layer 54 is, for example, a Ni/Au layer composed of a Ni layer covering the element electrode 52 and an Au layer provided on the Ni layer. The gold plating layer 42 is, for example, a Ni/Au layer composed of a Ni layer covering the top of the first bump electrode 40 and an Au layer provided on the Ni layer. The thickness of Ni layer and Au layer in the Ni/Au layer exemplified in the patent specification as a gold plating layer which is not limited to the gold plating 42 are about 3 μm and about 0.3 μm, respectively, for instance.

A second insulating resin layer 60 is provided on the first insulating layer 30 and the first circuit element 50, so that the first circuit 50 is sealed between the first insulating resin layer 30 and the second insulating resin layer 60. This structure protects the first circuit element 50 against the external environment. For example, this structure suppresses moisture from entering the first circuit element 50.

The second insulating resin layer 60 may be made of, for example, a thermosetting resin such as a melamine derivative (e.g., BT resin), liquid-crystal polymer, epoxy resin, PPE resin, polyimide resin, fluorine resin, phenol resin, polyamide bismaleimide, or the like.

A plurality of bump electrodes 70 are formed on the one face of the wiring layer 20 disposed on the periphery of the first circuit element 50. The second bump electrode 70 is formed integrally with the second wiring layer 20. This structure enhances the connection strength between the second bump electrode 70 and the wiring layer 20. The length of protrusion of the second bump electrode 70 is greater than that of the first bump electrode 40. The length of protrusion of the second bump electrode 70 is the length from one face of the wiring layer 20 to a top surface of the second bump electrode 70. Also, the length of protrusion of the first bump electrode 40 is the length from one face of the wiring layer 20 to a top surface of the first bump electrode 40.

The length of protrusion of the second bump electrode 70 is preferably greater than or equal o the distance from a surface of the first circuit element 50 opposite to the electrode forming surface thereof. As a result, the second bump electrode 70 plays the role of constituting a principal part of conductor connecting an element electrode 82 of a second circuit element 80 described later.

The second bump electrode 70 either penetrates the first insulating resin layer 30 and the second insulating layer 60 or constitutes a principal part of conductor penetrating the first insulating resin layer 30 and the second insulating layer 60. Thus, the second bump electrodes 70 contribute to the electrical connection between the element electrode 82 of a second circuit element 80 described later and the wiring layer 20. The positions of the second bump electrodes 70 to be placed will be discussed later. The diameter of top of the second bump electrode 70 and the length of protrusion thereof are about 20 μm and about 100 μm, for instance.

The second bump electrode 70 has a side shape having a local maximum diameter in a protruded position corresponding to the length of protrusion of the first bump electrode 40 or in a protruded position closer to a second circuit element 80 side than the protruded position corresponding thereto. The "side shape having a local maximum diameter" meant here is a side shape such that the diameter gradually increases (becomes thicker) along the protrusion direction and gradually decreases (becomes thinner) after passing a certain protruded position. In the first embodiment, the diameter of the second bump electrode 70 becomes locally maximum near the interface between the first insulating resin layer 30 and the second insulating resin layer 60 or in a protruded position on a second circuit element 80 side. By employing this structure, the contact area between the second bump electrode 70 and the first insulating resin layer 30 and the contact area between the second bump electrode 70 and the second insulating resin layer 60 increase, so that the adhesion between the second bump electrode 70 and the first insulating resin layer 30 and the adhesion between the second bump electrode 70 and the second insulating resin layer 60 can be enhanced.

The electrode forming surface of the second circuit element 80, which is disposed counter to the one face of the wiring layer 20, namely which is positioned downward, is mounted on the second insulating resin layer 60. The second circuit element 80 is an active element such as an integrated circuit (IC) and a large-scale integrated circuit (LSI). An element electrode 82 is provided, as an external connection terminal, on the electrode forming surface of the second circuit element 80. The element electrode 82 is formed of a metal such as aluminum.

The second circuit element 80 is positioned above the first circuit element 50, and the arrangement like this forms a stacked structure of the second circuit element 80 and the first circuit element 50. The positional relationship between the second circuit element 80 and the first circuit element 50 is such that at least part of peripheral regions of the second circuit element 80 extends relative to the lateral ends of the first circuit element 50. In the first embodiment, the size of the second circuit element 80 is larger than that of the first circuit element 50, and the whole peripheral regions of the second circuit element 80 extend outwardly from the lateral ends of the first circuit element 50.

As viewed planarly from a circuit element stacking direction, the positions of the second bump electrodes 70 to be placed are contained in the peripheral regions extending relative to the lateral ends of the first circuit element 50 in a region where the second circuit element 80 is mounted.

The element electrode 82 is disposed in a position corresponding to the second bump electrode 70 and is electrically connected to the second bump electrode 70. More specifically, the surface of the element electrode 82 is covered with a gold plating layer 84. On the other hand, top of the second bump electrode 70 is covered with a gold plating layer 72. The formation of the gold-gold bonding between the element electrode 82 and the second bump electrode 70 enhances the connection reliability between the element electrode 82 and the second bump electrode 70. The gold plating layer 84 is, for example, a Ni/Au layer composed of a Ni layer covering the element electrode 82 and an Au layer provided on the Ni layer. The gold plating layer 72 is, for example, a Ni/Au layer composed of a Ni layer covering the top of the second bump electrode 70 and an Au layer provided on the Ni layer.

The second circuit element 80 is sealed by a sealing resin layer 90. This structure protects the second circuit element 80 against the external environment. For example, this structure suppresses moisture from entering the second circuit element 80.

A photo solder resist layer 100 is so provided as to cover the other face of the wiring layer 20 and the exposed surface of the first insulating resin layer 30. Provision of the photo solder resist layer 100 reduces the chance of damaging the wiring layer 20 and the insulating resin layer 30 due to the heat generated when solder balls (described later) are soldered. In the photo solder resist layer 100, openings are formed in positions corresponding to the mounting positions of the solder balls 110.

The solder balls 110 are bonded to the wiring layer 20 in predetermined mounting positions, namely in the openings provided in the photo solder resist layer 100. The positions in which the solder balls 110 are placed are ends where circuit wiring is extended (rewired) from the positions of the second bump electrodes 70 through the wiring layer 20.

By employing the semiconductor module 10 according to the first embodiment, the first circuit element 50 and the second circuit element 80, which are both positioned downward, are stacked and mounted. And the first circuit element 40 and the second circuit element 80 are electrically connected to the wiring layer 20 using the first bump electrode 40 and the second bump electrode 70 formed integrally with the wiring layer 20, respectively. The first bump electrode and the second bump electrode 70 do not form or involve a loop as formed when the bonding wire is used. Accordingly, the impediments to the reduction in the height or width of the semiconductor module 10 are resolved and therefore the size and the thickness of the semiconductor module can be further reduced.

Also, the diameters of the first bump electrode 40 and the second bump electrode 70 are larger than the diameter of a bonding wire (e.g., gold wire), so that the first bump electrode 40 and the second bump electrode 70 function as excellent thermal conductive passages. Hence, the heat radiation of the semiconductor module 10 can be improved.

(Fabrication Method of Semiconductor Module)

A method for manufacturing a semiconductor module 10 according to the first embodiment will now be described with reference to FIGS. 2A to 4D. FIGS. 2A to 4D are cross-sectional views showing a sequence of processes in a method for fabricating the semiconductor module 10 according to the first embodiment.

Figures 2A, 2B, 2C, 2D, 2E, 2F:
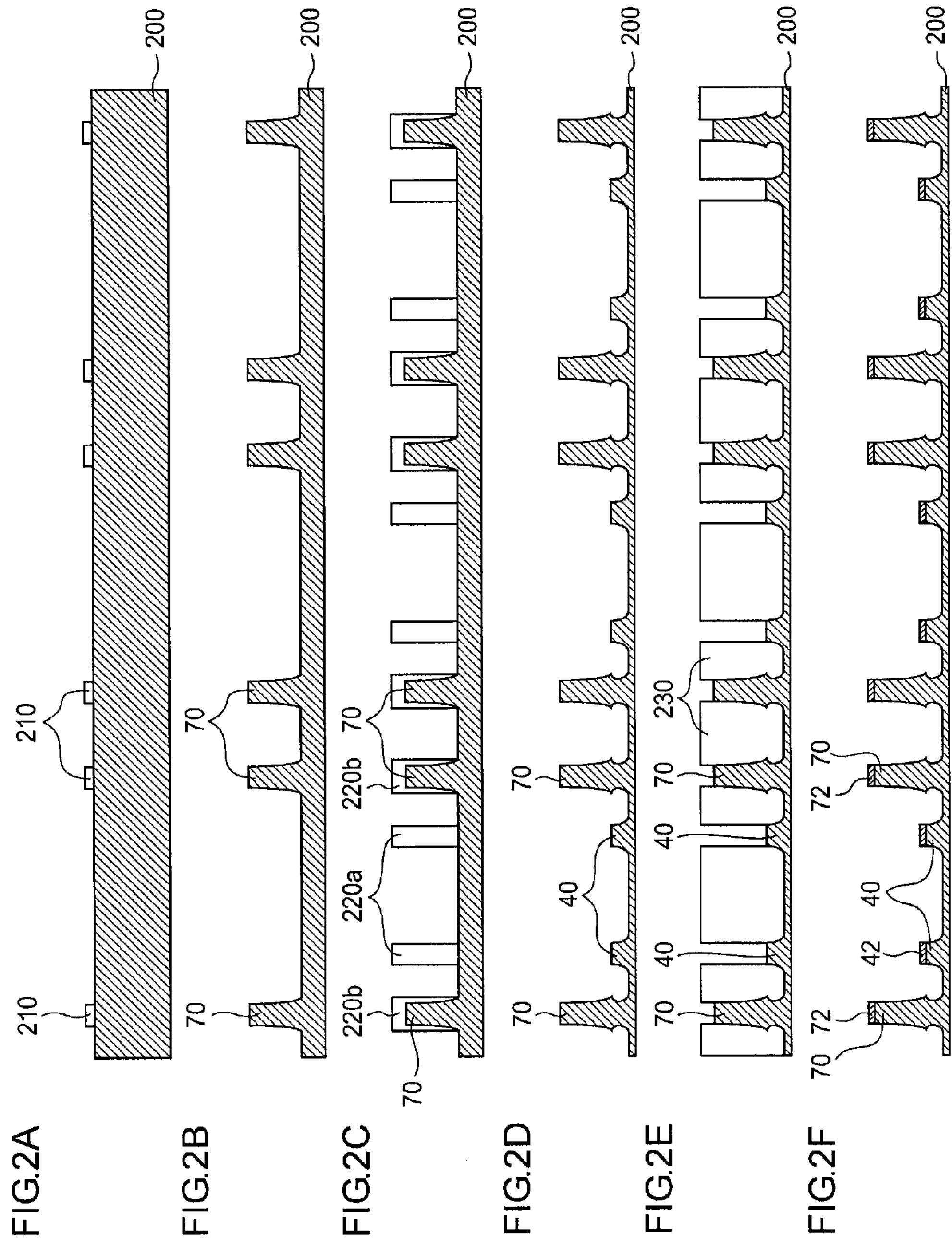
FIGS. 2A to 2F are cross-sectional views showing a sequence of processes in a method for fabricating a semiconductor module according to a first embodiment of the present invention.

Firstly, as shown in FIG. 2A, resists 210 are selectively formed in alignment with the regions, for forming the second bump electrodes 70, as shown in FIG. 1, using a photolithography method. More specifically, a resist film of predetermined thickness is affixed to one face of a copper sheet 200 by a laminator apparatus, and it is exposed using a photo mask having an exposure pattern in alignment with the regions for forming the second bump electrodes 70. After this, the resists in the unexposed areas are removed by a development using a $Na_2CO_3$ solution, which will selectively form the resists 210 on the copper sheet 200. To improve the adhesion of the resists 210 to the copper sheet 200, it is desirable that a pretreatment, such as grinding, cleaning and the like, be performed as appropriate on the surface of the copper sheet 200 before the lamination of the resist film thereon.

As shown in FIG. 2B, the exposed portions of the copper sheet 200 are wet-etched using a ferric chloride solution. In this case, the depth of etching corresponds to the difference between the length of protrusion of the second bump electrode 70 and that of the first bump electrode shown in FIG. 1. In other words, the length of protrusion of the second bump electrode 70 is longer than that of the first bump electrode 40 by the depth of etching in the etching process. Then the resists 210 are removed using a stripping agent such as an NaOH solution and thus the shape of the second bump electrode 70 on the tip end thereof appears. The depth of etching in this etching process is about 80 μm, for instance.

As shown in FIG. 2C, resists 220 are selectively formed on an etching surface of the copper sheet 200 in alignment with the regions, for forming the first bump electrode 40 and the second bump electrodes 70, as shown in FIG. 1 using the photolithography method. More specifically, a resist film of predetermined thickness is affixed to one face (etching surface) of a copper sheet 200 by the laminator apparatus, and it is exposed using a photo mask having an exposure pattern in alignment with the regions for forming the firs bump electrodes 40 and the second bump electrodes 70. After this, the resists in the unexposed areas are removed by a development using a $Na_2CO_3$ solution, which will selectively form the resists 220 (220*a* and 220*b*) on the copper sheet 200.

More specifically, the resists 220*a* are selectively formed on the regions for forming the first bump electrodes 40. On the other hand, the resists 220*b* are selectively formed on the regions for forming the second bump electrodes 70 and also cover the tip of the second bump electrode 70.

As shown in FIG. 2D, the exposed portions of the copper sheet 200 are wet-etched using the ferric chloride solution. In this case, the depth of etching corresponds to the length of protrusion of the first bump electrode 40 shown in FIG. 1. Then the resists 220 are removed using a stripping agent such as an NaOH solution and thus the shapes of the first bump electrode 40 and the second bump electrode 70 appear. The depth of etching in this etching process is about 20 μm, for instance. In this etching process, a lower part of the second bump electrode 70 is partially cut away with an upper part of the second bump electrode 70 being masked, so that the diameter of the second bump electrode 70 becomes locally maximum in a protruded position, of the second bump electrode 70, corresponding to the length of protrusion of the first bump electrode 40. In the process of FIG. 2C, the diameter of the resist 220*b* is set smaller than that of a base of the bump electrode 70 protruded from the copper sheet 200. In other words, the base of the bump electrode 70 protruded from the copper sheet 200 is exposed around the resist 200*b*, so that the diameter of the bump electrode 70 can be locally maximum in a protruded position above the position corresponding to the length of protrusion of the first bump electrode 40.

Then, as shown in FIG. 2E, gold-resistant resists 230 are selectively formed using the photolithography method such that the top surfaces of the first bump electrodes 40 and the second bump electrodes 70 are exposed. More specifically, a resist film of predetermined thickness is affixed to one face of the copper sheet 200 by the laminator apparatus, and it is exposed using a photo mask having a pattern where the regions for forming the second bump electrodes 40 and the second bump electrodes 70 are not exposed. After this, gold-resistant resists 230 in the unexposed areas are removed by a development using a $Na_2CO_3$ solution, which will selectively form the gold-resistant resists 230 on the copper sheet 200.

Then, Ni/Au layers are formed on openings of the gold-resistant resists 230, namely the top surfaces of the first bump electrodes 40 and the second bump electrodes 70, respectively, by using an electroless plating method. Then the gold-resistant resists 230 are removed using a stripping agent such as an NaOH solution and thus Au plating layers 42 and Au plating layers 72 appear.

Figures 3A, 3B, 3C, 3D:
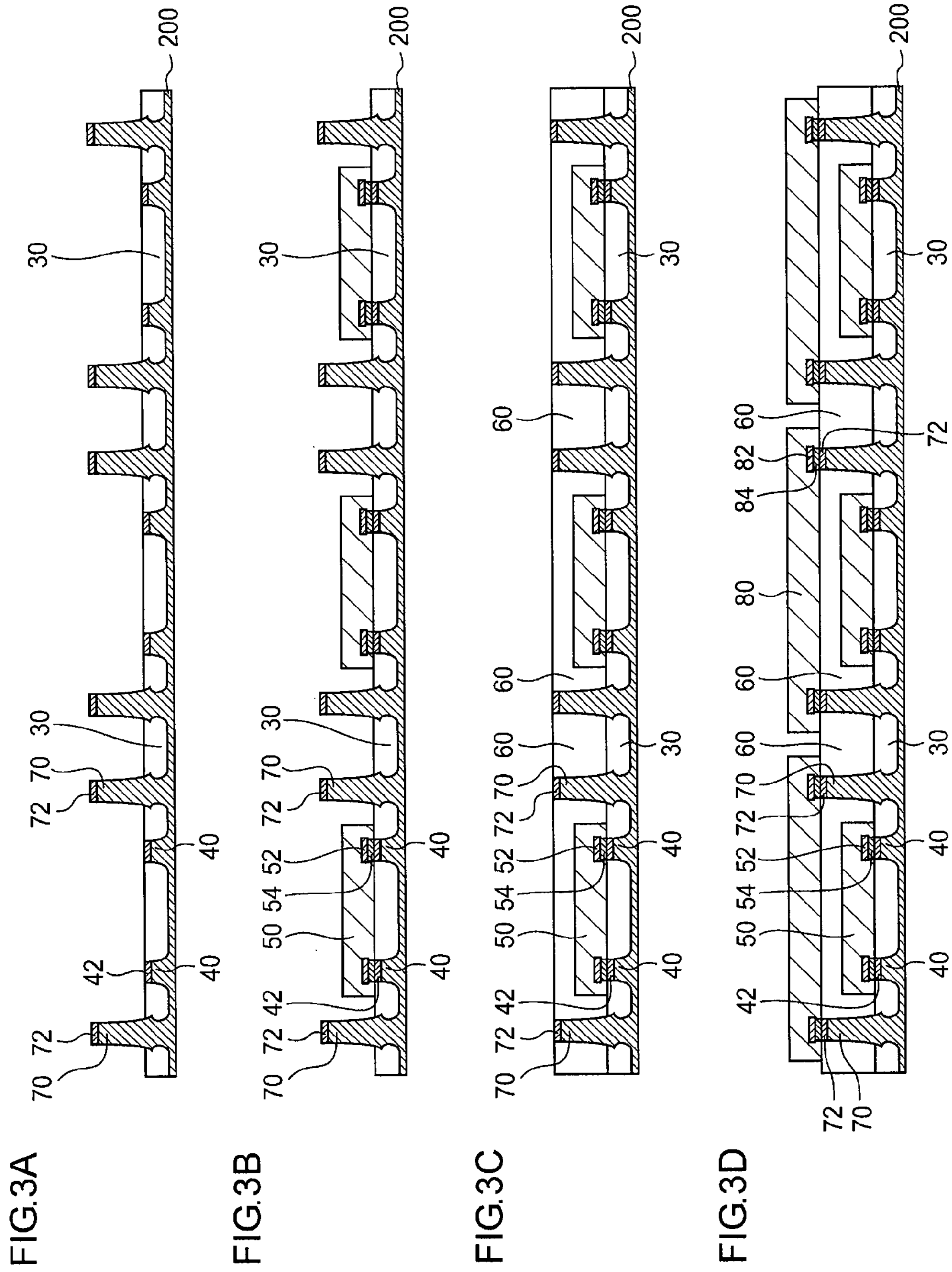
FIGS. 3A to 3D are cross-sectional views showing a sequence of processes in a method for fabricating a semiconductor module according to a first embodiment of the present invention.

Then, as shown in FIG. 3A, a first insulating resin layer 30 is formed such that the Au plating layers 42 are exposed on bump electrode forming surfaces of the copper sheet 200. More specifically, an appropriate amount of epoxy resin in the form of liquid is spin-coated by a coater, thereby forming the first insulating resin layer 30.

Then, as shown in FIG. 3B, the first circuit element 50 is mounted on the first insulating resin layer 30 with the electrode forming surface of the first circuit element 50 faced downward (positioned downward), and the Au plating layer 54 covering the element electrode 52 and the Au plating layer 42 provided on top of the first bump electrode 40 are bonded together by gold-gold bonding (Au—Au bonding).

Then, as shown in FIG. 3C, a second insulating resin layer 60 is formed such that the Au plating layers 72 are exposed on the first insulating resin layer 30. More specifically, a film-like epoxy resin is laminated on a substrate by a vacuum laminator, so that the second insulating resin layer 60 can be formed.

Then, as shown in FIG. 3D, the second circuit element 80 is mounted on the second insulating resin layer 60 with the electrode forming surface of the second circuit element 80 faced downward (positioned downward), and the Au plating layer 84 covering the element electrode 82 and the Au plating layer 72 provided on top of the second bump electrode 70 are bonded together by gold-gold bonding.

Figure 4A:
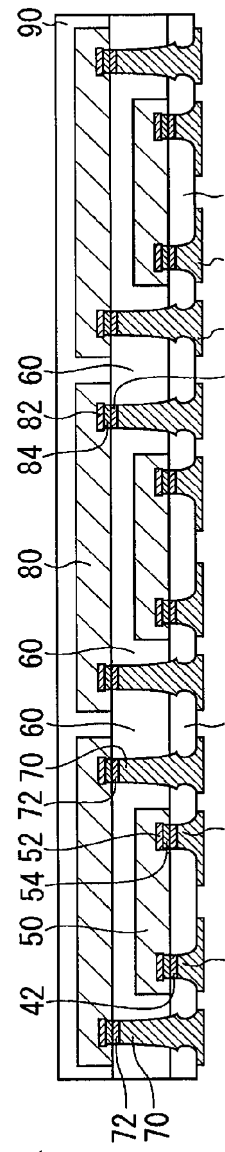
FIGS. 4A to 4D are cross-sectional views showing a sequence of processes in a method for fabricating a semiconductor module according to a first embodiment of the present invention.

Then, as shown in FIG. 4A, epoxy resin is molded on the second circuit element 80 and the second insulating resin layer 60 by using a transfer mold method, thereby forming a sealing resin layer 90. Then the other face of the copper sheet 200 is patterned by using a photolithography method and an etching method so as to form a wiring layer 20.

Figure 4B:
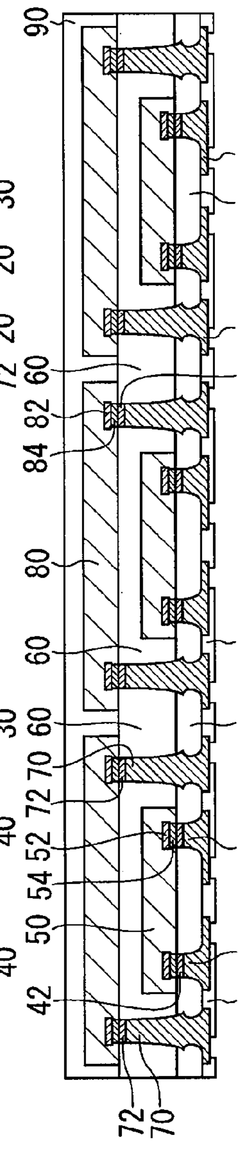

Then, as shown in FIG. 4B, exposed portions of the wiring layer 20 and the insulating resin layer 30 are covered, and a photo solder resist layer 100 having openings in the mounting regions of the solder balls 110 described later are formed. More specifically, the whole of exposed portions of the wiring layer 20 and the insulating resin layer 30 is covered with the photo solder resist layer 100 and then the openings are formed in the mounting regions of the solder balls 110 using the photolithography method.

Figure 4C:
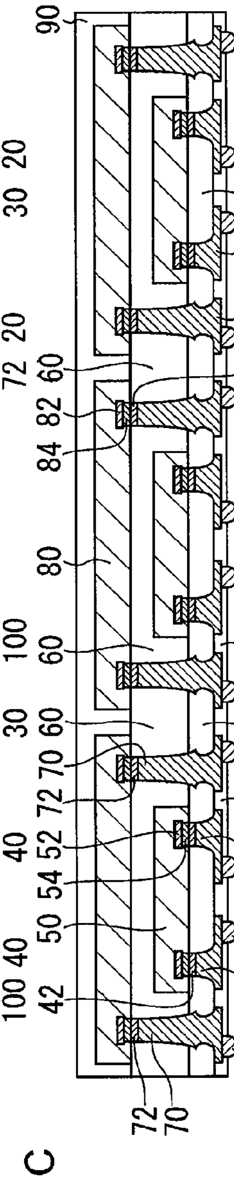
Figure 4D:
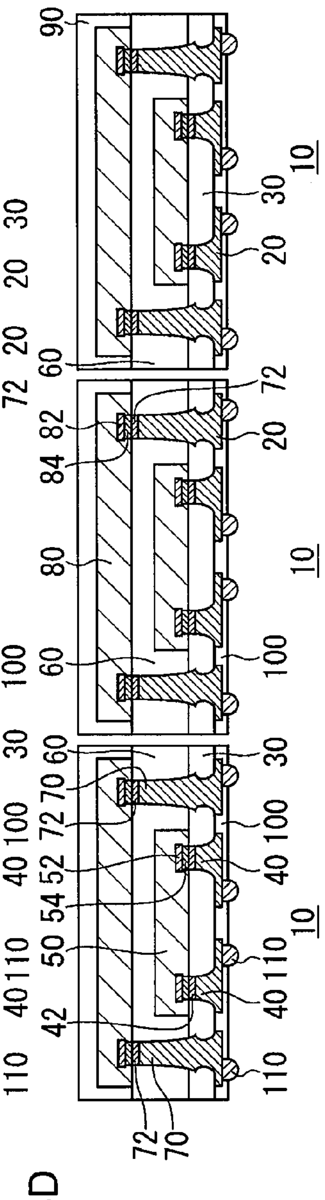

Then, as shown in FIG. 4C, the solder balls 110 are mounted in the openings 110 of the photo solder resist layer 100 by using a screen printing method. More specifically, the solder balls 110 are formed by printing soldering paste, which is a pasty mixture of resin and solder material, in desired positions through a screen mask and then heating the printed paste to a solder melting temperature.

Then, as shown in FIG. 4C, a semiconductor wafer is diced into individual modules by performing a dicing process using a dicing apparatus.

A semiconductor module 10 according to the first embodiment is thus manufactured through the processes as described above.

Second Embodiment

Figure 5:
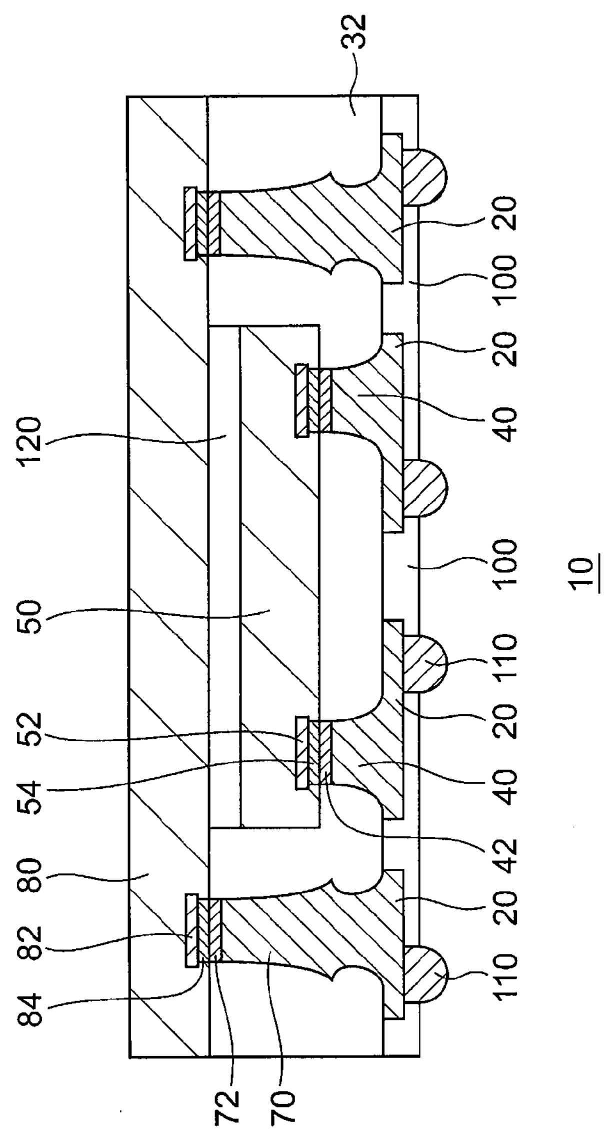
FIG. 5 is a cross-sectional view showing a structure of a semiconductor module according to a second embodiment of the present invention.

FIG. 5 is a cross-sectional view showing a structure of a semiconductor module 10 according to a second embodiment of the present invention. The basic structure of the semiconductor module 10 according to the second embodiment is similar to that according to the first embodiment. A description is hereinbelow given of the semiconductor module 10 according to the second embodiment centering around the differences in structure and components from the semiconductor module 10 according to the first embodiment.

In the second embodiment, an insulating resin layer 32 is formed between the first circuit element 50 and the wiring layer 20 and between the second circuit element 80 and the wiring layer 20. In other words, the insulating resin layer 30 and the second insulating resin layer 60 in the semiconductor module 10 of the first embodiment are replaced by the insulating resin layer 32.

The first circuit element 50 and the second circuit element 80 are bonded together with an insulating adhesive 120. Further, the top surface of the semiconductor module 10 is not sealed with a resin as with the first embodiment, and the rear surface of the second circuit element 80 is exposed.

By employing the semiconductor module 10 according to the second embodiment, the same advantageous effects of reduced size and thickness and improved heat radiation as those in the first embodiment are achieved. In addition to these advantageous effects, the components corresponding to the first insulating resin layer 32 and the second insulating resin layer 60 in the semiconductor module 10 of the first embodiment are formed by the single insulating resin layer 32 and therefore the structure of the semiconductor module 10 can be simplified and the cost therefor is reduced. Also, since the rear surface of the second circuit element 80 is exposed in the top surface of the semiconductor module 10, the heat generated in the second circuit element 80 is easily radiated to the exterior of the semiconductor module 10. Hence, the heat radiation of the semiconductor module 10 is further improved.

(Fabrication Method of Semiconductor Module)

A method for manufacturing a semiconductor module 10 according to the second embodiment will now be described with reference to FIGS. 6A to 7C. FIGS. 6A to 7C are cross-sectional views showing a sequence of processes in a method for fabricating the semiconductor module 10 according to the second embodiment.

The processes covered by FIG. 2A to 2F in the first embodiment are identical in the method for manufacturing the semiconductor module 10 according to the second embodiment.

Figure 6A:
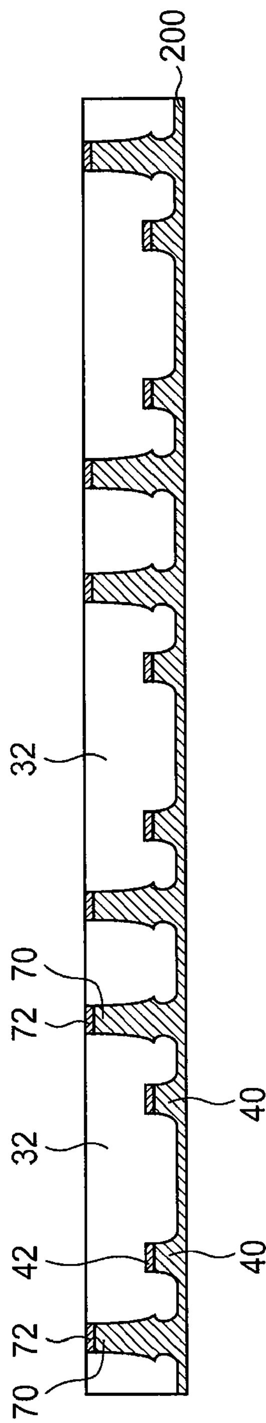
FIGS. 6A to 6C are cross-sectional views showing a sequence of processes in a method for fabricating a semiconductor module according to a second embodiment of the present invention.

After the process shown in FIG. 2F, the insulating resin layer 32 is formed on a bump electrode forming surface of the copper sheet 200 as shown in FIG. 6A. More specifically, a film-like epoxy resin is laminated on a substrate by the vacuum laminator, so that the insulating resin layer 32 can be formed.

Figure 6B:
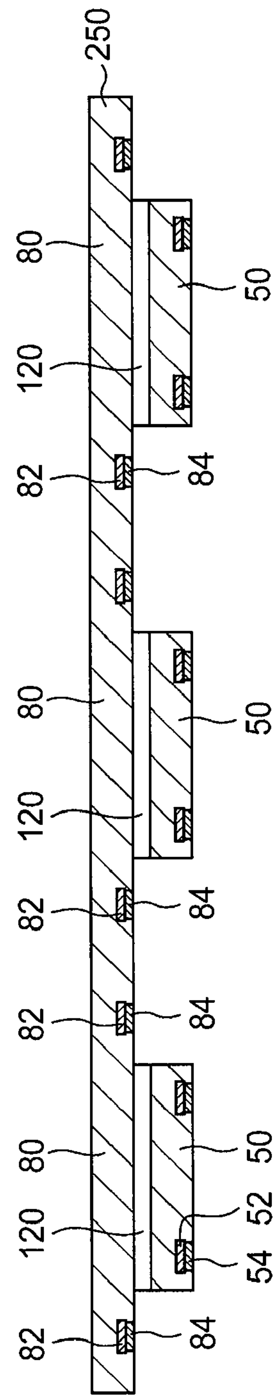

On the other hand, as shown in FIG. 6B, the first circuit element 50 is bonded with an adhesive 120 to predetermined positions of a silicon substrate 250 where the second circuit elements 80 are formed in a matrix. More specifically, the surface, of each first circuit element 50, opposite to the electrode forming surface thereof is adhered beforehand to a central part of the electrode forming surface of each second circuit element 80. In other words, a plurality of first circuit elements 50 are adhered to the silicon substrate 250 in such a manner that each first circuit element 50 is surrounded by the peripheral region of each second circuit element 80 where the element electrodes 82 are formed.

Figure 6C:
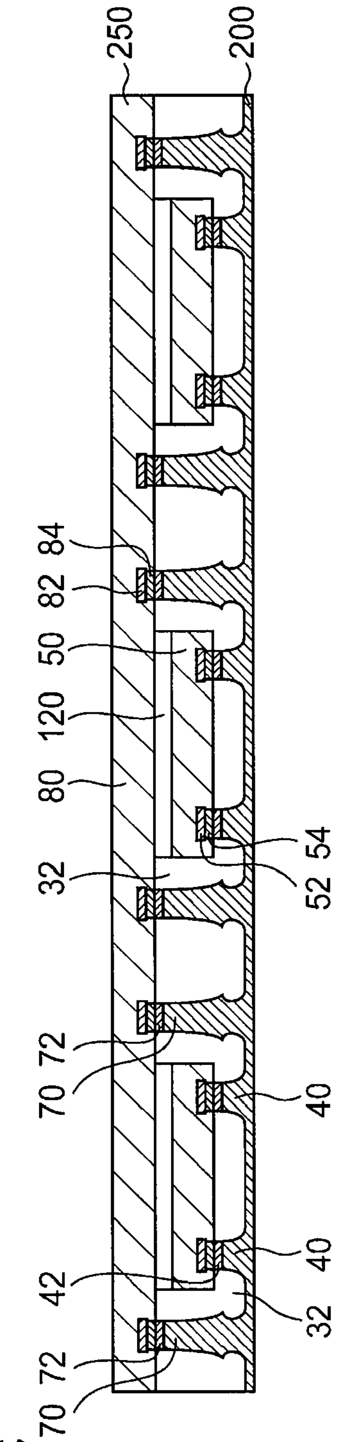

Then, as shown in FIG. 6C, the first circuit element 50, the silicon substrate 250 and the copper sheet 200 are press-bonded, thereby bonding together the gold plating layer 54 of the first circuit element 50 and the gold plating layer 42 provided on top of the first bump electrode 40 by Au—Au bonding. In parallel with this process, the gold plating layer 84 of the second circuit element 80 and the gold plating layer 72 provided on top of the second bump electrode 70 are bonded together by Au—Au bonding. If the thickness of each gold plating layer is equal to each other, the length of the second electrode 70 will be set longer than that of the first bump electrode 40 by the sum of the thickness of the first circuit element 50 and the thickness of the adhesive 120. As a result, in the process for press-bonding the first circuit element 50 to the silicon substrate 250, the element electrode 52 and the element electrode 82 can be electrically connected to the first bump electrode 40 and the second bump electrode, respectively, all at once.

Figure 7A:
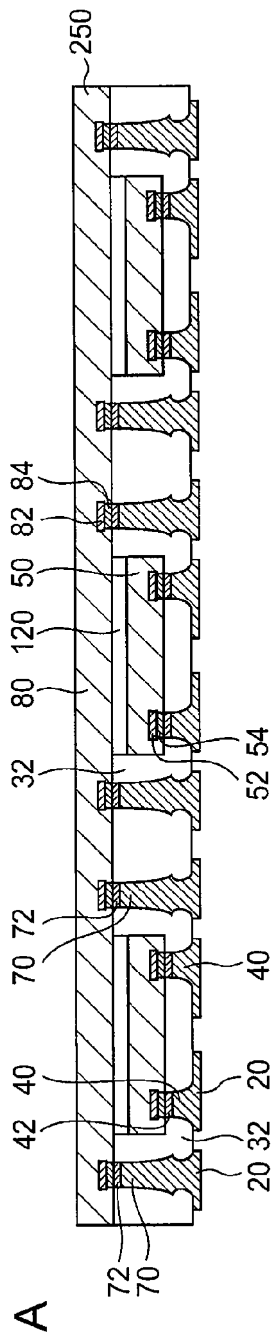
FIGS. 7A to 7C are cross-sectional views showing a sequence of processes in a method for fabricating a semiconductor module according to a second embodiment of the present invention.

Then, as shown in FIG. 7A, the other face of the copper sheet 200 is patterned by using the photolithography method and etching method so as to form the wiring layer 20.

Figure 7B:
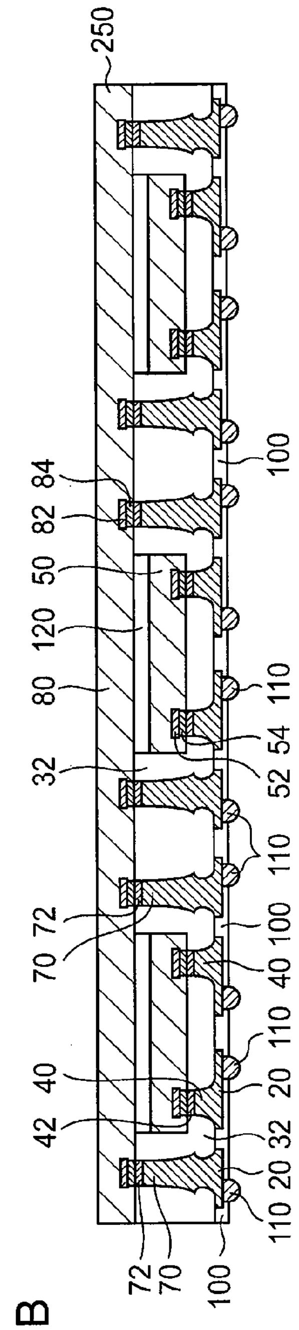

Then, as shown in FIG. 7B, similarly to the manufacturing method of the first embodiment (see FIGS. 4B and 4C), the photo solder resist layers 100 and the solder balls 100 are formed on the other side of the wiring layer 20.

Figure 7C:
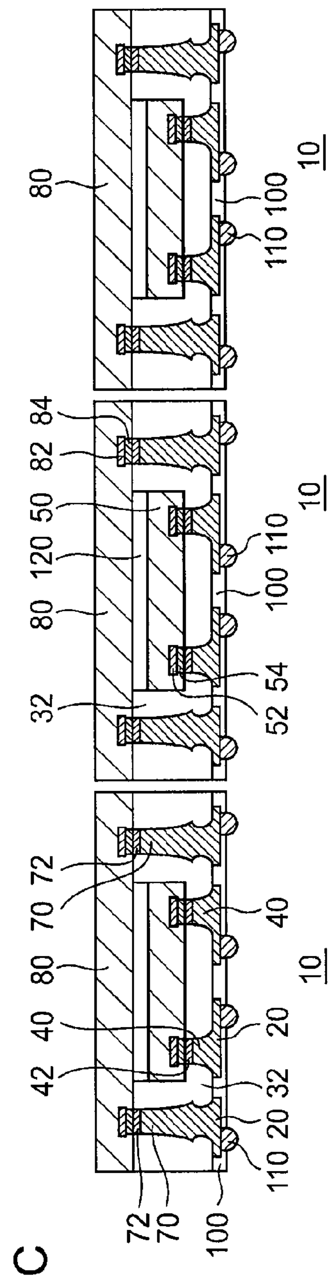

Then, as shown in FIG. 7C, a semiconductor wafer is diced into individual modules by performing a dicing process using the dicing apparatus.

A semiconductor module 10 according, to the second embodiment is thus manufactured through the processes as described above.

Third Embodiment

Figure 8:
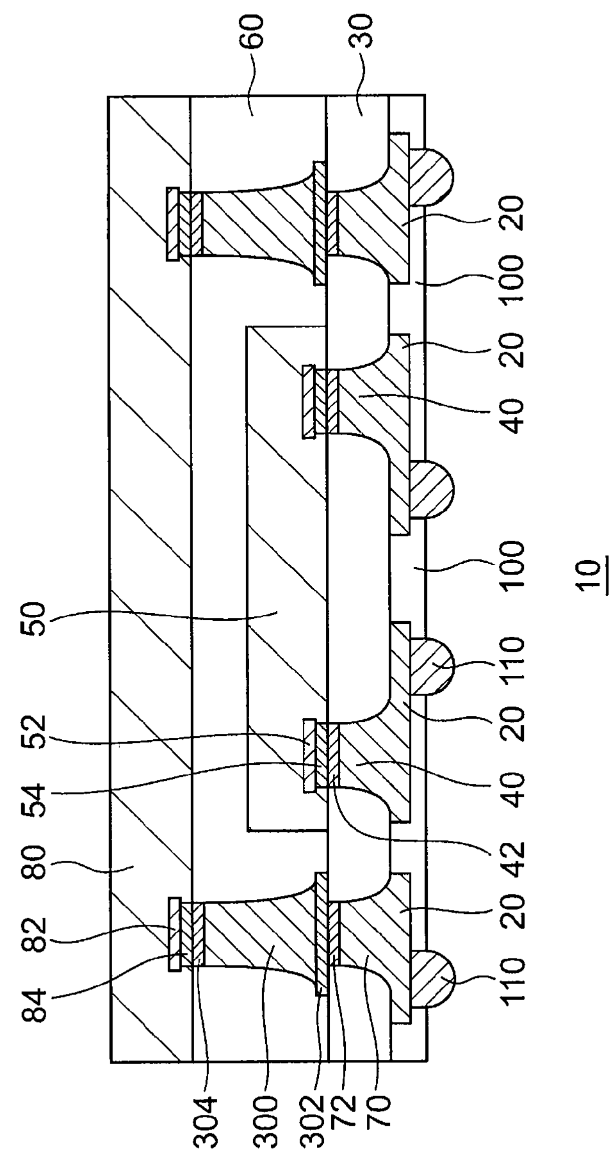
FIG. 8 is a cross-sectional view showing a structure of a semiconductor module according to a third embodiment of the present invention.

FIG. 8 is a cross-sectional view showing a structure of a semiconductor module 10 according to a third embodiment of the present invention. In the semiconductor module 10 according to the third embodiment, the length of protrusion of the second bump electrode 70 is equal to that of the first bump electrode 40. A conductor 300 is stacked on the second bump electrode 70, and the distance from a surface, of the conductor 300, facing the electrode forming surface of the second circuit 80 to the surface thereof facing one face of the wiring layer 20 is longer than the length of protrusion of the first bump electrode 40.

In the semiconductor module 10, the conductor 300 is provided on the second bump electrode 70 in such manner that the gold plating layer 72 provided on top of the second bump electrode 70 and a gold plating layer 302 provided on bottom of the conductor 300 are bonded together by Au—Au bonding.

A gold plating layer 304 is provided in the upper surface of the conductor 300, and the gold plating layer 304 and the gold plating layer 84 of the second circuit element 80 are bonded together by Au—Au bonding. In this manner, the element electrode 82, the conductor 300 and the second bump electrode 70 are electrically connected to each other.

Similar to the second embodiment, in the third embodiment, the rear surface of the second circuit element 80 is exposed in the top surface of the semiconductor module 10.

By employing the semiconductor module 10 according to the third embodiment, the same advantageous effects of reduced size and thickness and improved heat radiation as those in the first embodiment are achieved. Also, since the rear surface of the second circuit element 80 is exposed in the top surface of the semiconductor module 10, the heat generated in the second circuit element 80 is easily radiated to the exterior of the semiconductor module 10. Hence, the heat radiation of the semiconductor module 10 is further improved.

(Fabrication Method of Semiconductor Module)

A method for manufacturing a semiconductor module 10 according to the second embodiment will now be described with reference to FIGS. 6A to 7C. FIGS. 6A to 7C are cross-sectional views showing a sequence of processes in a method for fabricating the semiconductor module 10 according to the second embodiment.

Figure 9A:
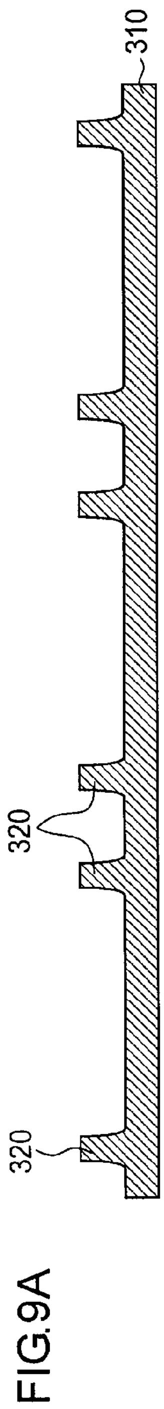
FIGS. 9A to 9E are cross-sectional views showing a sequence of processes in a method for fabricating a semiconductor module according to a third embodiment of the present invention.

Firstly, as shown in FIG. 9A, a copper sheet 310 is selectively etched to form bumps 320 in predetermined regions.

Figure 9B:
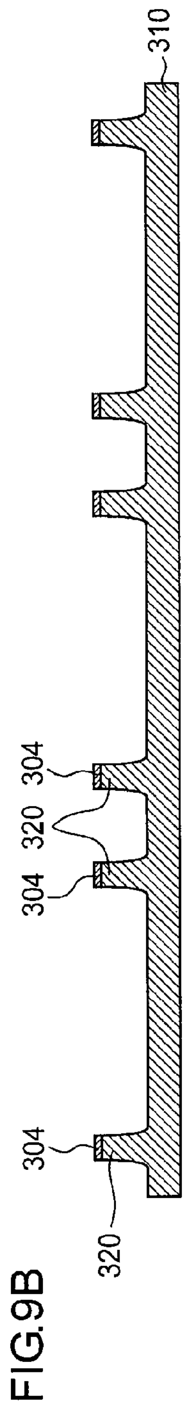

Then, as shown in FIG. 9B, a gold plating layer 304 is formed on top of the bump 320. The process for forming the gold plating layer 304 is the same as that described in conjunction with FIG. 2E.

Figure 9C:
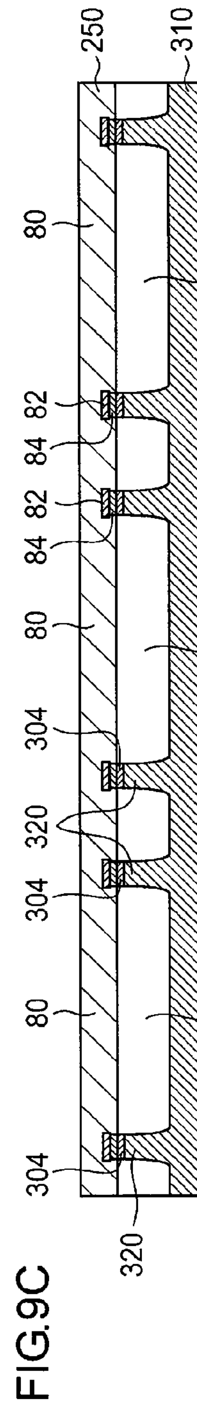

Then, as shown in FIG. 9C, the second insulating resin layer 60 is applied to a bump forming surface of the copper sheet 310 and then a silicon substrate 250 where the second circuit element 80 is formed in a matrix is temporarily press-bonded from above the second insulating resin layer 60. A temperature of 100° C. to 200° C. is kept for three minutes during the temporary press-bonding. At this time, the second insulating resin layer 60 is not completely hardened and has a fluidity.

Figure 9D:
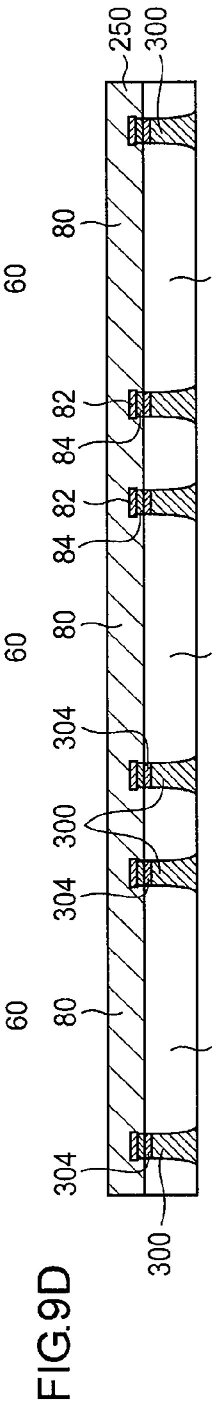

Then, as shown in FIG. 9D, the copper sheet 310 on the opposite side of the bump forming surface is etched down to form the conductor 300.

Figure 9E:
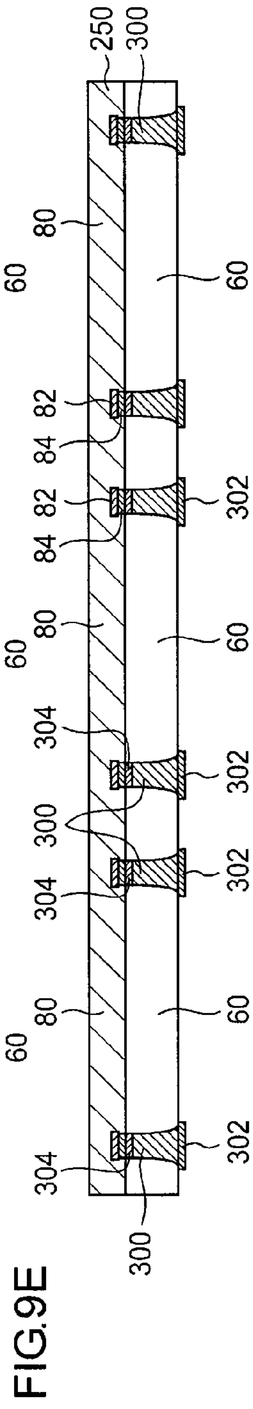

Then, as shown in FIG. 9E, a gold plating layer 302 is formed on bottom of the conductor 300. The process for forming the gold plating layer 302 is the same as that described in conjunction with FIG. 2E.

Figure 10A:
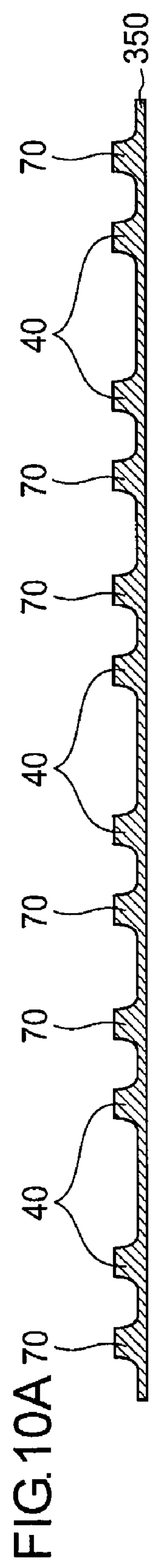
FIGS. 10A to 10C are cross-sectional views showing a sequence of processes in a method for fabricating a semiconductor module according to a third embodiment of the present invention.

On the other hand, as shown in FIG. 10A, a copper sheet 350 is selectively etched to form the first bump electrodes 40 and the second bump electrodes 70 in predetermined regions.

Figure 10B:
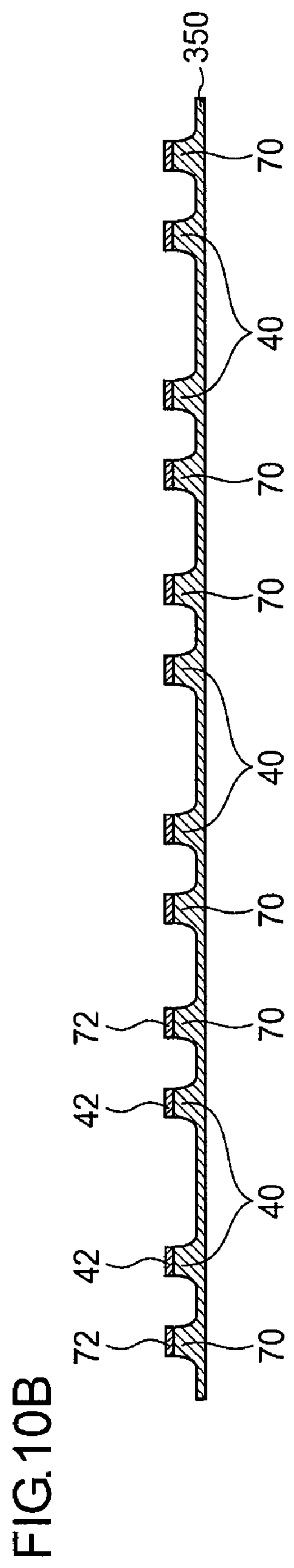

Then, as shown in FIG. 10B, the gold plating layer 42 and the gold plating layer 72 are formed on top of the first bump electrode 40 and top of the second bump electrode 70, respectively. The process for forming the gold plating layer 42 and the gold plating layer 72 is the same as that described in conjunction with FIG. 2E.

Then, as shown in FIG. 100, the first insulating resin layer 30 is applied to a bump forming surface of the copper sheet 350 and then the first circuit element 50 is mounted from above the first insulating resin layer 30. At this time, the gold plating layer 54 covering the element electrode 52 is aligned to the gold plating layer 42 connecting the top of the first bump electrode 40 and vice versa. In other words, the positions of the gold plating layer 54 thereof and the gold plating layer 42 are adjusted.

Figures 11A, 11B, 11C, 11D:
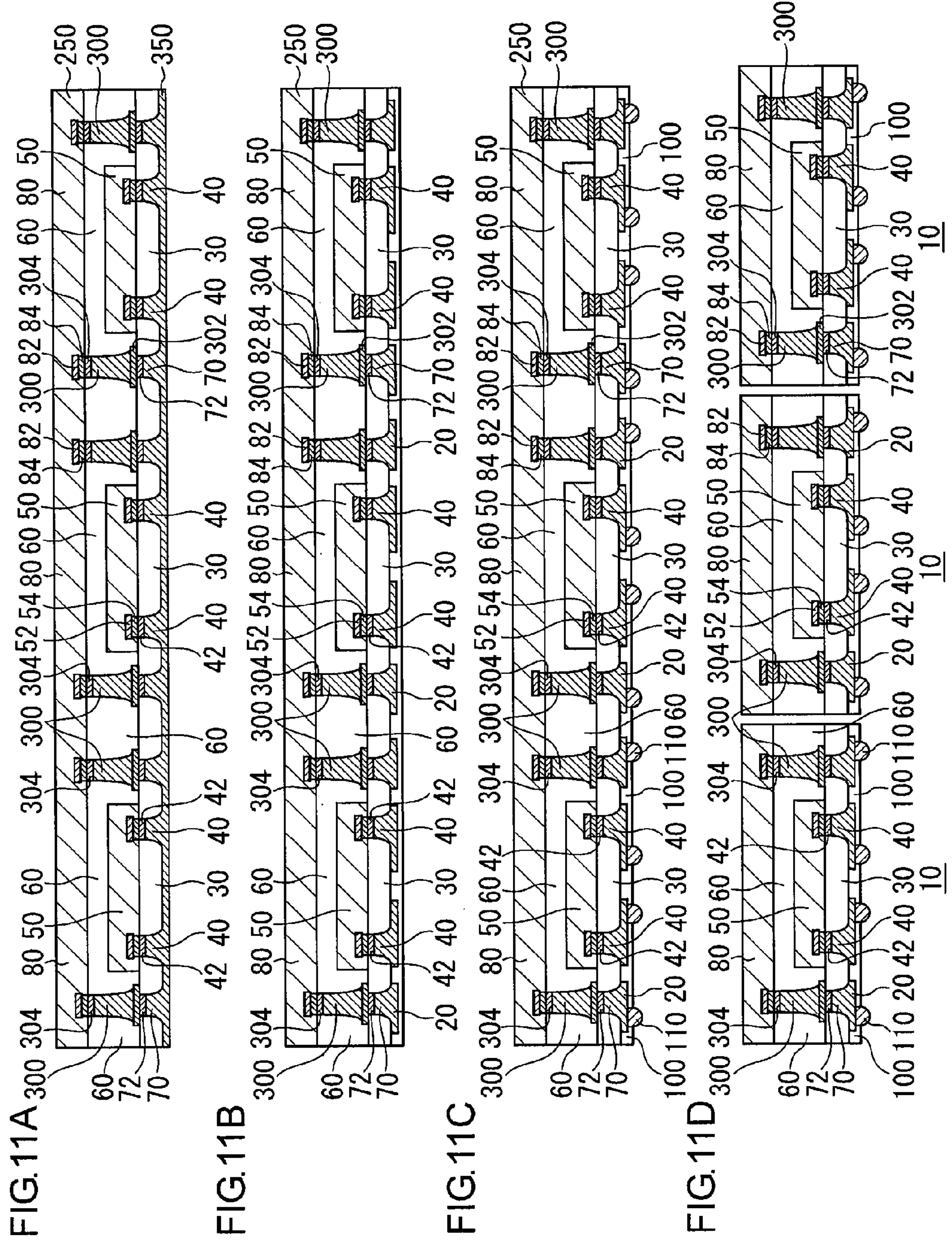
FIGS. 11A to 11D are cross-sectional views showing a process in a method for fabricating a semiconductor module according to a third embodiment of the present invention.

Then, as shown in FIG. 11A, the silicon substrate 250 where the conductor 300 and the second insulating resin layer 60 have been temporarily press-bonded are now finally and permanently press-bonded from above the first circuit element 50 and the insulating resin layer 30. A temperature of 200° C. is kept for ten minutes during the final press-bonding. Thus the first insulating resin layer 30 and the second insulating resin layer 60 are hardened.

Then, as shown in FIG. 11B, the other face of the copper sheet 350 is patterned by using a photolithography method and an etching method so as to form the wiring layer 20.

Then, as shown in FIG. 11C, similarly to the manufacturing method of the first embodiment (see FIGS. 4B and 4C), the photo solder resist layers 100 and the solder balls 100 are formed on the other side of the wiring layer 20.

Then, as shown in FIG. 11D, a semiconductor wafer is diced into individual modules by performing a dicing process using the dicing apparatus.

A semiconductor module 10 according to the third embodiment is thus manufactured through the processes as described above.

Fourth Embodiment

Figure 12:
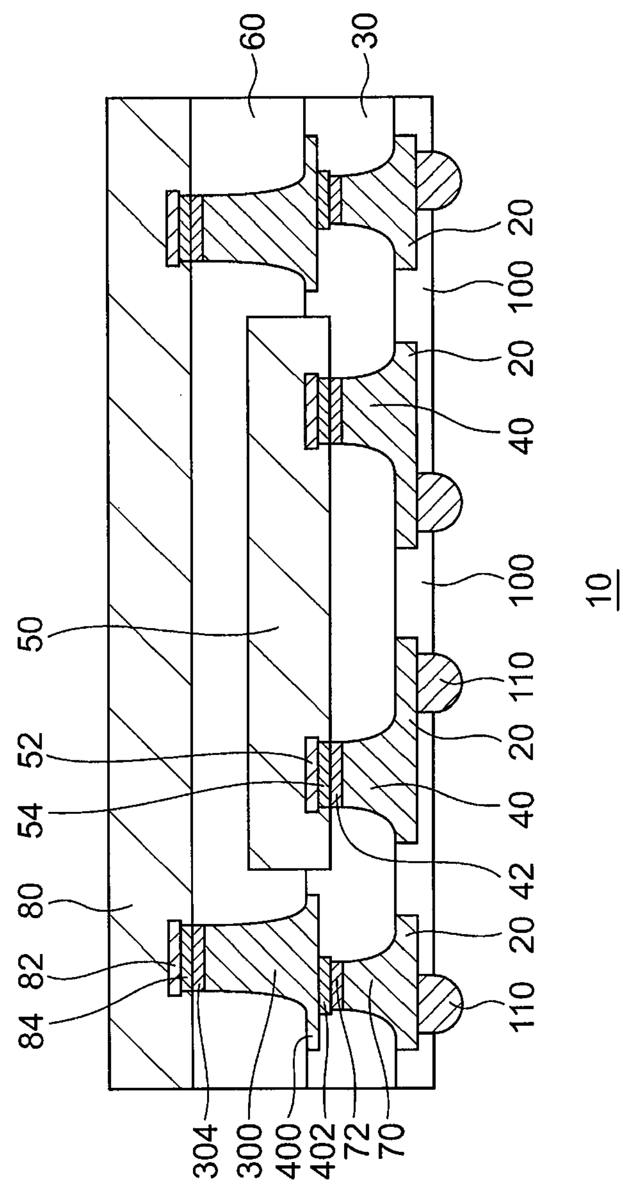
FIG. 12 is a cross-sectional view showing a structure of a semiconductor module according to a fourth embodiment of the present invention.

FIG. 12 is a cross-sectional view showing a structure of a semiconductor module 10 according to a fourth embodiment of the present invention. The fourth embodiment differs from the third embodiment in the following feature. That is, according to the fourth embodiment, a wiring layer 400 is formed on the second bump electrode 70, and a conductor 300 is formed integrally with the wiring layer 400. Thus the second bump electrode 70 and the conductor 300 are rewired.

More specifically, a gold plating layer 402 is provided in a predetermined position of the underside of the wiring layer 400 (i.e., in a predetermined position of a surface, of the wiring layer 400, disposed opposite to the wiring layer 20). The gold plating layer 402 and the gold plating layer 72 provided on top of the second bump electrode 70 are bonded together by Au—Au bonding. Also, in a position displaced in a surface direction from the gold plating 402, the conductor 300 is formed integrally with the top surface of the wiring layer 400. The gold plating layer 304 is provided on top of the conductor 300. The gold plating layer 304 and the gold plating layer 84 of the second plating layer 304 are bonded together by Au—Au bonding. In this manner, the element electrode 82, the conductor 300 and the wiring layer 400 are electrically connected to each other.

By employing the semiconductor module 10 according to the fourth embodiment, the same advantageous effects of reduced size and thickness and improved heat radiation as those in the first embodiment are achieved. Also, since the rear surface of the second circuit element 80 is exposed in the top surface of the semiconductor module 10, the heat generated in the second circuit element 80 is easily radiated to the exterior of the semiconductor module 10. Hence, the heat radiation of the semiconductor module 10 is further improved.

Also, in the fourth embodiment, the connection position in the other face of the wiring layer 400 to which the second bump electrode 70 is electrically connected is displaced in a surface direction from a conductor forming position on one face of he wiring layer 400. In other words, the second bump electrode 70 and the conductor 300 are rewired through the wiring layer 400, so that the degree of freedom in designing the wiring of the semiconductor module 10 can be enhanced. Also, optimizing the wiring structure enables further reduction in the size and thickness of the semiconductor module 10. For example, even when it is difficult to perform the rewiring through the wiring layer 20 due to a restriction imposed on a circuit design, circuit wiring required for the circuit design can be extended by performing the rewriting through the wiring layer 400.

(Fabrication Method of Semiconductor Module)

A method for manufacturing a semiconductor module 10 according to the fourth embodiment will now be described with reference to FIGS. 13A to 14D. FIGS. 13A to 14D are cross-sectional views showing a sequence of processes in a method for fabricating the semiconductor module 10 according to the fourth embodiment.

The processes covered by FIG. 9A to 9C in the third embodiment are identical in the method for manufacturing the semiconductor module 10 according to the fourth embodiment.

After the process shown in FIG. 9C, a face of copper sheet 310 opposite to the bump forming surface is half-etched and thereby the wiring layer 400 and the conductor 300 formed integrally with the wiring layer 400 are formed. At this time, the thickness of the wiring layer 400 is 10 μm, for instance.

Figure 13A:
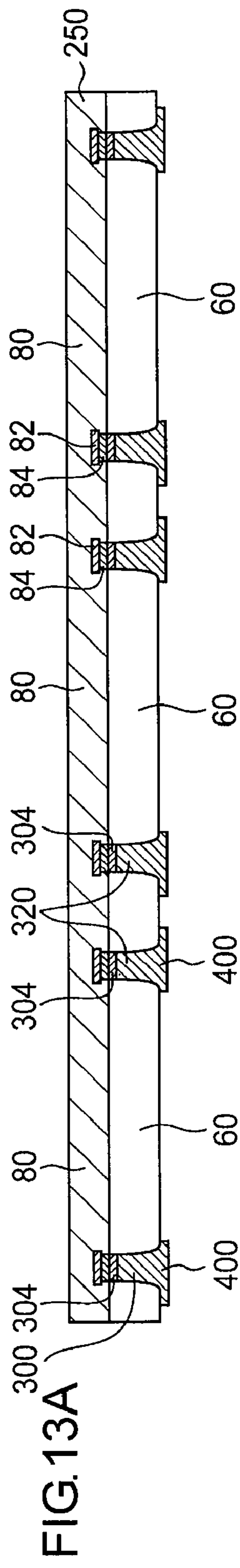
FIGS. 13A and 13B are cross-sectional views showing a sequence of processes in a method for fabricating a semiconductor module according to a fourth embodiment of the present invention.
Figure 13B:
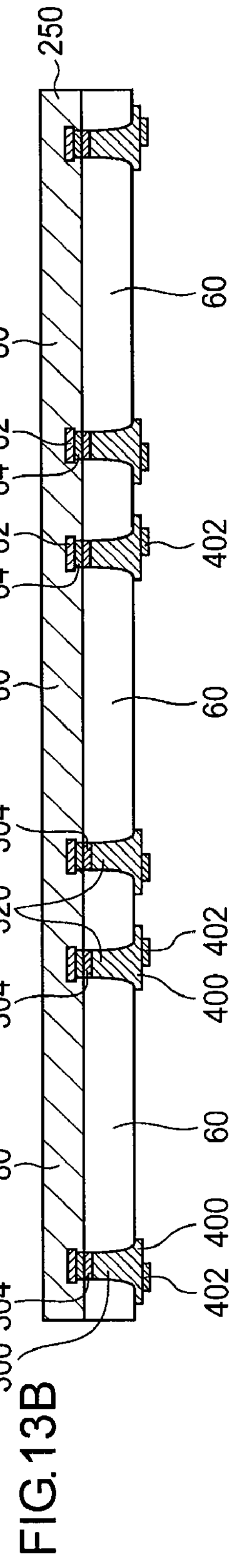

Then, as shown in FIG. 13B, the gold plating layer 402 is formed in a predetermined position of the underside of the wiring layer 400. The process for forming the gold plating layers 402 is the same as that described in conjunction with FIG. 2E.

Figure 10C:
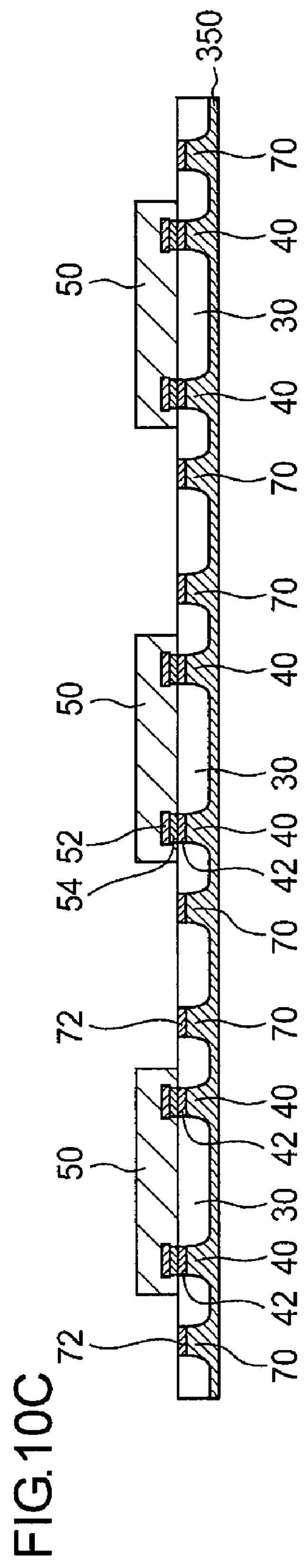

Similar to the manufacturing method of the third embodiment, on the other hand, the processes described in conjunction with FIGS. 10A to 10C are carried out.

Figure 14A:
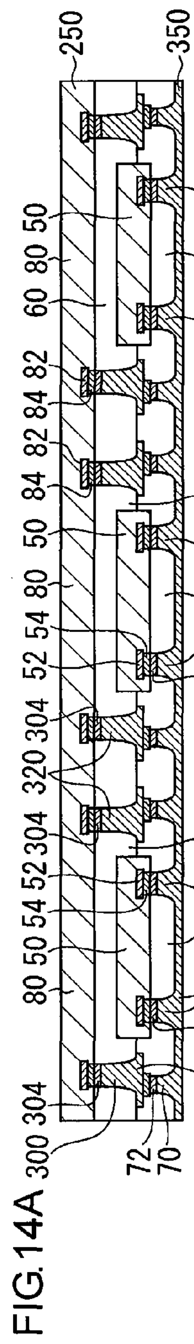
FIGS. 14A to 14D are cross-sectional views showing a sequence of processes in a method for fabricating a semiconductor module according to a fourth embodiment of the present invention.

Then, as shown in FIG. 14A, the silicon substrate 250 where the wiring layer 400, the conductor 300 and the second insulating resin layer 60 have been temporarily press-bonded are now finally and permanently press-bonded from above the first circuit element 50 and the insulating resin layer 30. A temperature of 200° C. is kept for ten minutes during the final press-bonding. Thus the first insulating resin layer 30 and the second insulating resin layer 60 are hardened.

Figure 14B:
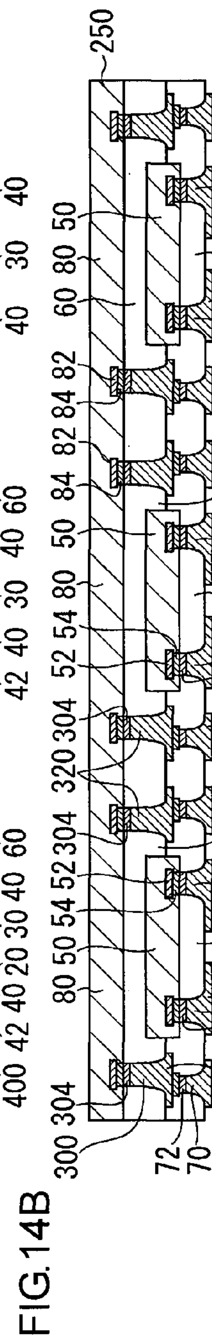

Then, as shown in FIG. 14B, the other face of the copper sheet 350 is patterned by using a photolithography method and an etching method so as to form the wiring layer 20.

Figure 14C:
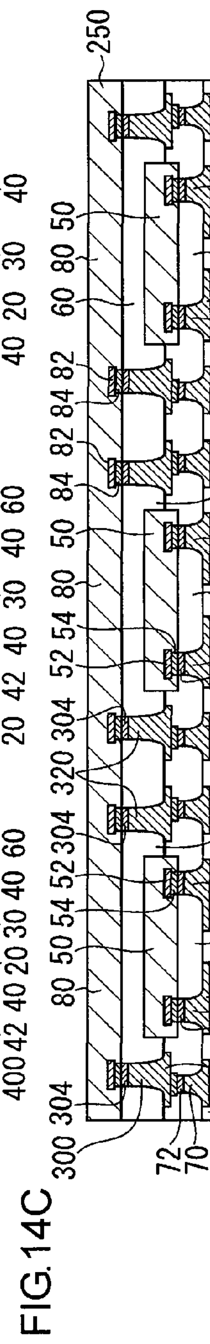

Then, as shown in FIG. 14C, similarly to the manufacturing method of the first embodiment (see FIGS. 4B and 4C), the photo solder resist layers 100 and the solder balls 100 are formed on the other side of the wiring layer 20.

Figure 14D:
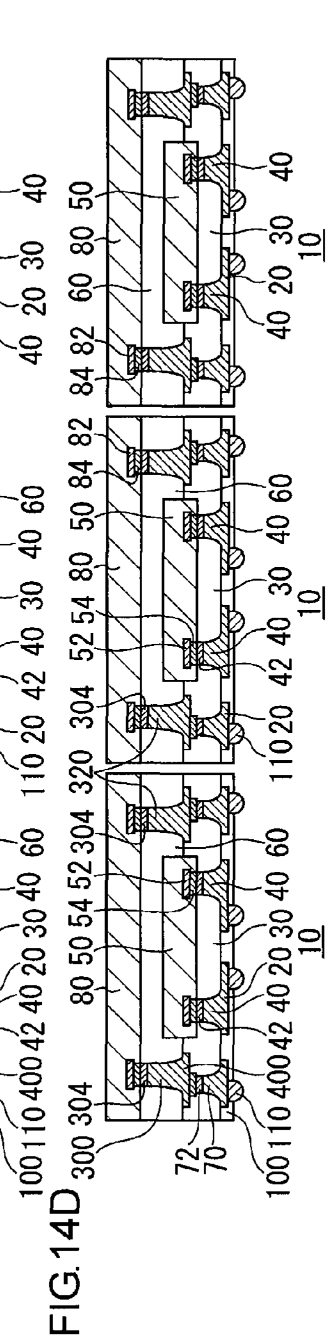

Then, as shown in FIG. 14D, a semiconductor wafer is diced into individual modules by performing a dicing process using the dicing apparatus.

Through the processes as described above, a semiconductor module. 10 according to the fourth embodiment can be manufactured.

(First Modification)

Figure 15:
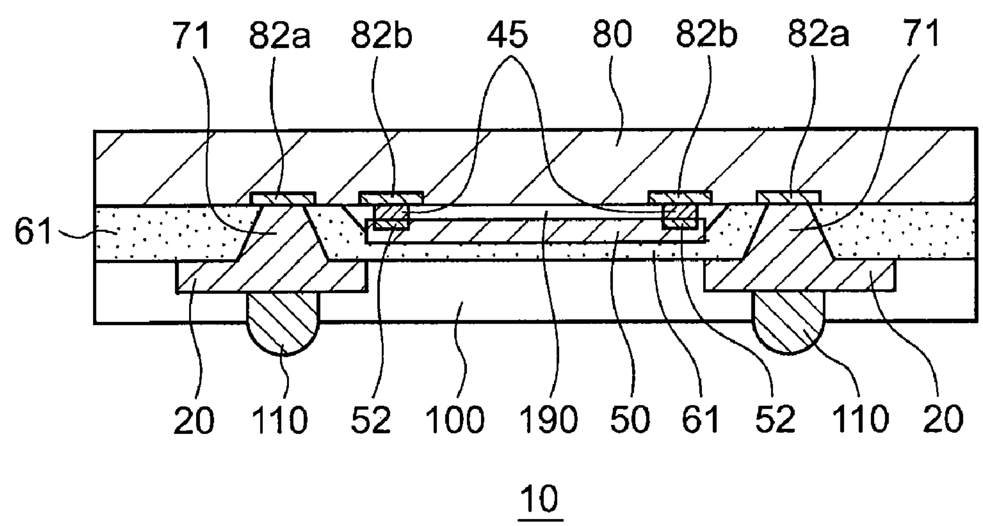
FIG. 15 is a cross-sectional view showing a structure of a semiconductor module according to a first modification.

FIG. 15 is a cross-sectional view showing a structure of a semiconductor module according to a first modification. The semiconductor module 10 according to the first modification may comprise: a wiring layer 20 having a predetermine pattern; a bump electrode 71 formed integrally with the wiring layer 71; a second circuit element 80 mounted in a state such that an electrode forming surface of the bump electrode 71 is disposed counter to one face of the wiring layer 20, an element electrode 82*a* electrically connected to the bump electrode 71 being provided on the electrode forming surface thereof; a first circuit element 50 provided between the one face of the wiring layer 20 and an electrode forming surface of the second circuit element 80.

An insulating resin layer 61 is provided between the wiring layer 20 and the second circuit element 80. The insulating resin layer 61 electrically insulates the wiring layer 20 and the second circuit element 80. The insulating resin layer 61 may be made of, for example, a thermosetting resin such as a melamine derivative (e.g., BT resin), liquid-crystal polymer, epoxy resin, PPE resin, polyimide resin, fluorine resin, phenol resin, polyamide bismaleimide, or the like.

Since the bump electrodes 71 are formed integrally with the wiring layer 20, the connection strength between the bump electrode 71 and the wiring layer 20 is enhanced. The bump electrode 71 penetrates the insulating resin layer 61 and therefore the bump electrode 71 contributes to the electrical connection between the wiring layer 20 and the element electrode 82*a* provided on the circuit element 80.

The first circuit element 50 is provided between the second circuit element 80 and the wiring layer 20 in a state such that an electrode forming surface of the first circuit element 50 is disposed counter to the electrode forming surface of the second circuit element 80. In other words, the first circuit element 50 is embedded into the insulating resin layer 61. That is, the same material as that constituting the insulating resin 61 is filled into a gap 190 between the first circuit element 50 and the second circuit element 80. However, the material filled in to the gap 190 is not limited thereto and, for example, an underfill formed principally of an epoxy resin may be filled thereinto. In the second circuit element 80, an element electrode 82*b* is provided in a position corresponding to the element electrode 52 provided on the electrode forming surface of the first circuit element. The element electrode 52 of the first circuit element 50 and the element electrode 82*b* of the second circuit element 80 are electrically connected through a solder ball 45, which is an electrical connection member, for example. Also, this electric connection member is not limited to the solder ball and, for example, a gold bump or copper bump may be used as the electric connection member instead.

A photo solder resist 100 is so provided as to cover the other face of the wiring layer 20 and the exposed surface of the insulating resin layer 61. Provision of the photo solder resist layer 100 reduces the chance of damaging the wiring layer 20 and the insulating resin layer 61 due to the heat generated when the solder balls 110 are soldered. In the photo solder resist layer 100, openings are formed in positions corresponding to the mounting positions of the solder balls 110.

The solder balls 110 are bonded to the wiring layer 20 in predetermined mounting positions, namely in the openings provided in the photo solder resist layer 100.

By employing the semiconductor module 10 according to the first modification, the first circuit element 50 is positioned in between the wiring layer 20 and the second circuit element 80. Thus, the first circuit element 50 can be mounted without adversely affecting the intended reduction in size and thickness of the semiconductor module 10.

(Second Modification)

Figure 16:
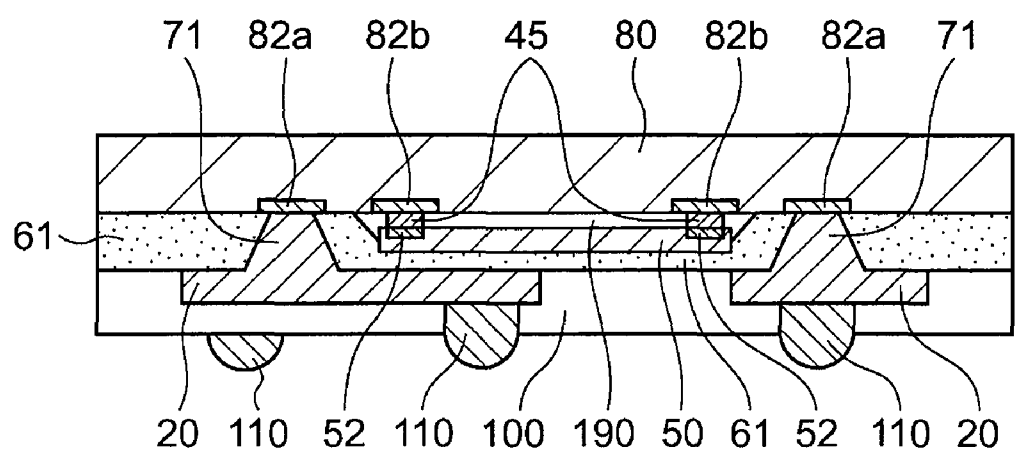
FIG. 16 is a cross-sectional view showing a structure of a semiconductor module according to a second modification.

FIG. 16 is a cross-sectional view showing a structure of a semiconductor module according to a second modification. The basic structure of the semiconductor module 10 according to the second modification is similar to that according to the first modification. In the semiconductor module 10 according to the second modification, the positions in which the solder balls 110 are placed are ends where circuit wiring is extended (rewired) from the positions of the bump electrodes 71 through the wiring layer 20, and are disposed below the second circuit element 80 and also disposed below the first circuit element 50. By employing the semiconductor module 10 according to the second modification 10, in addition to the advantageous effects achieved by the first modification, the degree of freedom in placement positions of the solder balls 110 can be enhanced and consequently the size of the semiconductor module 10 can be reduced.

(Third Modification)

Figure 17:
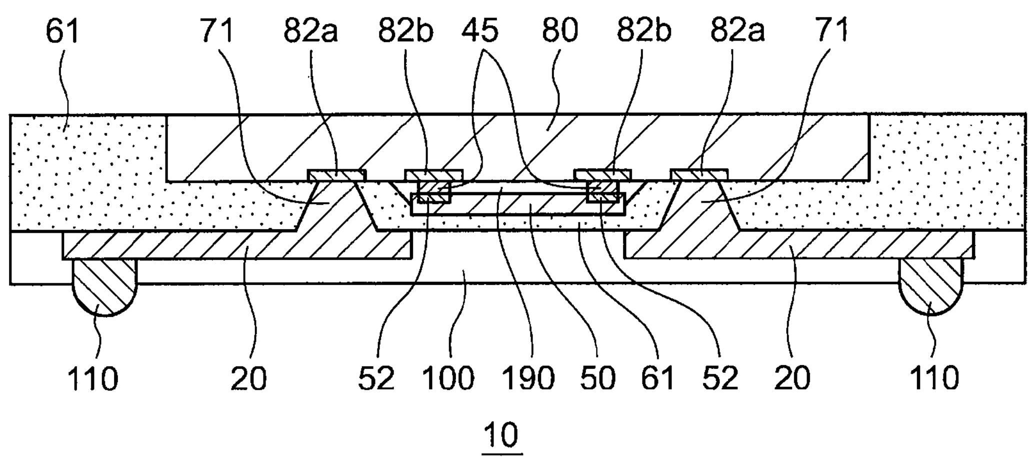
FIG. 17 is a cross-sectional view showing a structure of a semiconductor module according to a third modification.

FIG. 17 is a cross-sectional view showing a structure of a semiconductor module according to a third modification. In the semiconductor module 10 according to the third modification, the positions in which the solder balls 110 are placed are ends where circuit wiring is extended (rewired) from the positions of the bump electrodes 71 through the wiring layer 20, and are disposed outside the second circuit element 80. The insulating resin layer 61 is also provided lateral to the second circuit element 80, so that the side surfaces of the second circuit element 80 are covered with the insulating resin layers 61. By employing the semiconductor module 10 according to the third modification 10, in addition to the advantageous effects achieved by the first modification, the degree of freedom in placement positions of the solder balls 110 can be enhanced. Also, the side surfaces are covered with the insulating resin layers 61, thereby suppressing moisture from entering a joint portion between the bump electrode 71 and the element electrode 82*a*.

In the above-described first to third modifications, a Si interposer where a wiring layer is formed may be used in place of the second circuit element 80.

(Application to Mobile Apparatus)

Next, a description will be given of a mobile apparatus (portable device) provided with the above-described semiconductor modules. The mobile apparatus presented as an example herein is a mobile phone, but it may be any electronic apparatus, such as a personal digital assistant (PDA), a digital video cameras (DVC), a music player and a digital still camera (DSC).

Figure 18:
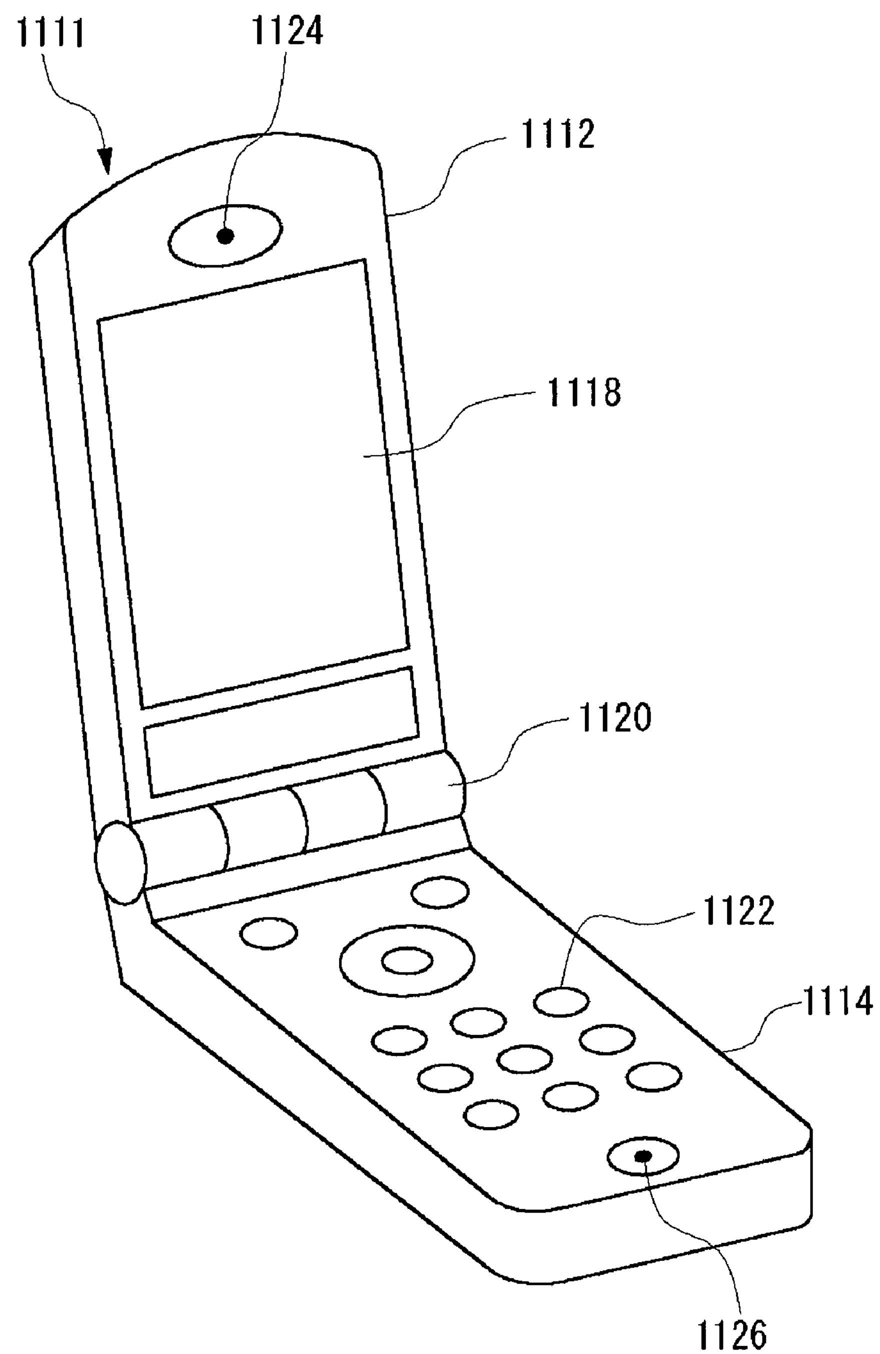
FIG. 18 illustrates a structure of a mobile phone provided with a semiconductor module according to an embodiment of the present invention.

FIG. 18 illustrates a structure of a mobile phone provided with a semiconductor module according to any of the above-described embodiments. A mobile phone 1111 has a structure including a first casing 1112 and a second casing 1114 jointed together by a movable part 1120. The first casing 1112 and the second casing 1114 are turnable/rotatable around the movable part 1120 as the axis. The first casing 212 is provided with a display unit 1118 for displaying characters, images and other information and a speaker unit 1124. The second casing 1114 is provided with a control module 1122 with operation buttons and the like and a microphone 1126. Note that a semiconductor module according to any of the above-described embodiments is mounted within a mobile phone 1111 such as this. The semiconductor module, according to each embodiment, mounted on a mobile phone may be used for a power supply circuit used to drive each circuit, an RF generation circuit for generating RF, a digital-to-analog converter (DAC), an encoder circuit, a driver circuit for a backlight used as the light source of a liquid-crystal panel used for a display of the mobile phone, and the like.

Figure 19:
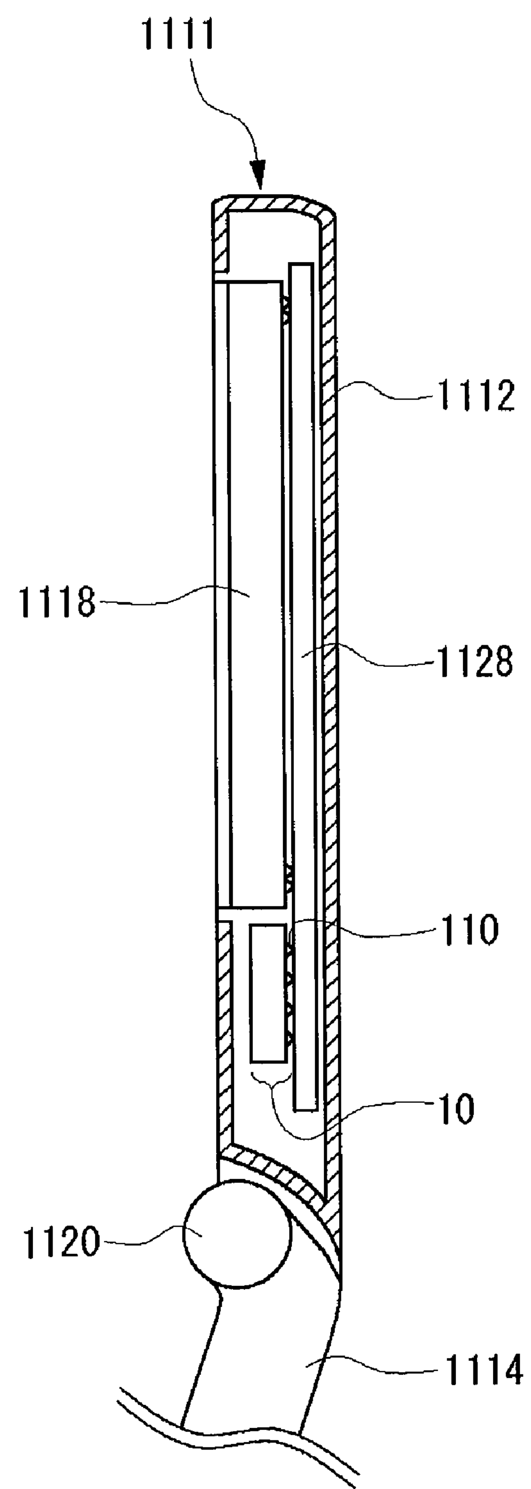
FIG. 19 is a partial cross-sectional view of a mobile phone shown in FIG. 18.

FIG. 19 is a partial cross-sectional view (cross-sectional view of the first casing 1112) of the mobile phone shown in FIG. 18. The semiconductor module 10 according to each of the above-described embodiments is mounted on a printed circuit board 1128 via the solder bumps 110 and is coupled electrically to the display unit 1118 and the like by way of the printed circuit board 1128.

According to the mobile apparatus provided with a semiconductor module according to any of the above-described embodiments, the following advantageous effects can be achieved.

Since the semiconductor module 10 according to the above-described embodiments can be made smaller and thinner, the mobile device incorporating such the semiconductor module 10 can be made smaller and thinner.

The present invention is not limited to the above-described embodiments and modifications only, and it is understood by those skilled in the art that various modifications such as changes in design may be further made based on their knowledge and the embodiments added with such modifications are also within the scope of the present invention.

In the above-described first embodiment, the melted first insulating resin layer 40 is applied such that the gold plating layer 42 is exposed. For example, the gold plating layer 42 may be exposed in such a manner that the film thickness of the first insulating resin layer 30 is hardened and then the film thickness of the hardened first insulating resin layer 30 is thinned by the use of $O_2$ plasma etching.

What is claimed is:

1. A semiconductor module comprising:

a single wiring layer having a predetermine pattern;

a first bump electrode formed integrally with said wiring layer on one face of said wiring layer;

a first circuit element mounted in a state such that an electrode forming surface of said first circuit element is disposed counter to the one face of said wiring layer, an element electrode directly electrically connected to said first bump electrode being provided on the electrode forming surface thereof;

a second bump electrode formed integrally with said wiring layer on the one face thereof on a periphery of said first circuit element, the length of protrusion of said second bump electrode being greater than that of said first bump electrode; and a second circuit element mounted above said first circuit element in a state such that an electrode forming surface of said second circuit element is disposed counter to the one face of said wiring layer, an element electrode directly electrically connected to said second bump electrode being provided on the electrode forming surface thereof.

2. A semiconductor module according to claim 1, wherein the length of protrusion of said second bump electrode is greater than or equal to the distance from a surface of said first circuit element opposite to the electrode forming surface thereof to the one face of said wiring layer.

3. A semiconductor module according to claim 1, wherein said second bump electrode has a side shape having a local maximum diameter in a protruded position corresponding to the length of protrusion of said first bump electrode or in a protruded position closer to a second circuit element side than the protruded position corresponding thereto.

4. A semiconductor module according to claim 1, wherein another metallic layers including gold-gold bonding layers are provided between said first bump electrode and the element electrode provided in said first circuit element and/or between said second bump electrode and the element electrode provided in said second circuit element, respectively.

5. A semiconductor module comprising:

a single wiring layer having a predetermine pattern;

a first bump electrode formed integrally with said wiring layer on one face thereof;

a first circuit element mounted in a state such that an electrode forming surface of said first circuit element is disposed counter to the one face of said wiring layer, an element electrode directly electrically connected to said first bump electrode being provided on the electrode forming surface thereof;

a second bump electrode formed integrally with said wiring layer on the one face thereof on a periphery of said first circuit element;

a conductor disposed above said second bump electrode and connected directly electrically to said second bump electrode; and a second circuit element mounted above said first circuit element in a state such that an electrode forming surface of said second circuit element is disposed counter to the one face of said wiring layer, an element electrode electrically connected to said conductor being provided on the electrode forming surface thereof, wherein the distance from a second circuit element side of said conductor to the one face of said wiring layer is larger than the length of protrusion of said first bump electrode.

6. A semiconductor module according to claim 5, wherein the distance from a second circuit element side of said conductor to the one face of said wiring layer is larger than or equal to the distance from a surface of said first circuit element opposite to the electrode forming surface thereof to the one face of said wiring layer.

7. A semiconductor module according to claim 5, further comprising another wiring layer, provided between said second bump electrode and said conductor, on one face of which said conductor is integrally formed with, wherein a connection position of said another wiring layer in the other surface thereof, to which said second bump electrode is electrically connected, is dislocated relative to a forming position and a surface orientation of said conductor on one face of said another wiring layer.

* * * * *